United States Patent
You

(10) Patent No.: US 12,236,993 B2
(45) Date of Patent: Feb. 25, 2025

(54) MEMORY DEVICE DETECTING WEAKNESS OF OPERATION PATTERN AND METHOD OF OPERATING THE SAME

(71) Applicant: SAMSUNG ELECTRONICS CO., LTD., Suwon-si (KR)

(72) Inventor: Jungmin You, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 18/052,469

(22) Filed: Nov. 3, 2022

(65) Prior Publication Data

US 2023/0178136 A1  Jun. 8, 2023

(30) Foreign Application Priority Data

Dec. 2, 2021 (KR) .......... 10-2021-0171202
Apr. 27, 2022 (KR) .......... 10-2022-0052229

(51) Int. Cl.
*G11C 11/406* (2006.01)
*G11C 11/408* (2006.01)

(52) U.S. Cl.
CPC .. *G11C 11/40615* (2013.01); *G11C 11/40622* (2013.01); *G11C 11/4085* (2013.01)

(58) Field of Classification Search
CPC ............ G11C 11/4085; G11C 11/4062; G11C 11/4061
USPC ........................................... 365/222
See application file for complete search history.

(56) References Cited

U.S. PATENT DOCUMENTS

| | | | |
|---|---|---|---|
| 8,938,573 B2* | 1/2015 | Greenfield | G11C 11/40611 711/101 |
| 9,032,141 B2* | 5/2015 | Bains | G06F 13/1636 711/106 |
| 9,431,085 B2 | 8/2016 | Greenberg et al. | |
| 9,812,185 B2 | 11/2017 | Fisch et al. | |
| 10,262,717 B2 | 4/2019 | Fisch et al. | |
| 10,475,503 B2* | 11/2019 | Yoo | G11C 11/4085 |
| 10,885,966 B1 | 1/2021 | Devaux et al. | |
| 10,916,293 B1 | 2/2021 | Lai et al. | |
| 11,037,618 B2 | 6/2021 | Lee et al. | |
| 11,049,544 B2 | 6/2021 | Devaux et al. | |
| 11,264,079 B1* | 3/2022 | Roberts | G11C 7/24 |
| 2021/0049269 A1 | 2/2021 | Ghosh et al. | |
| 2021/0151095 A1* | 5/2021 | Nale | G06F 3/0673 |

(Continued)

OTHER PUBLICATIONS

Wikipedia, "Linear congruential generator." last updated Sep. 9, 2022, Retrieved from "https://en.wikipedia.org/wiki/Linear_congruential_generator" Total 12 pages.

*Primary Examiner* — Sung Il Cho
(74) *Attorney, Agent, or Firm* — Sughrue Mion, PLLC

(57) ABSTRACT

Provided are a memory device for detecting a weakness of an operation pattern and a method of operating the same. The method includes: storing address information and activation count information regarding N word lines from among the plurality of word lines in a register including N entries; based on activation of a first word line different from the N word lines, storing address information and activation count information regarding the first word line in an entry from which information is evicted from among the N entries; and generating first weakness information based on a number of evictions performed on the register during a first period.

20 Claims, 15 Drawing Sheets

(56) References Cited

U.S. PATENT DOCUMENTS

| | | | | |
|---|---|---|---|---|
| 2021/0183433 A1* | 6/2021 | Jenkinson | ............ | G11C 11/4087 |
| 2022/0050793 A1* | 2/2022 | Saroiu | .................... | G06F 21/556 |
| 2022/0059153 A1* | 2/2022 | Zhang | .................. | G11C 11/406 |
| 2022/0091784 A1* | 3/2022 | Brandl | .............. | G11C 11/40611 |
| 2022/0188015 A1* | 6/2022 | Kim | ...................... | G06F 3/0604 |
| 2022/0189538 A1* | 6/2022 | Kim | ...................... | G11C 11/408 |
| 2022/0230670 A1* | 7/2022 | Kim | ...................... | G11C 11/406 |
| 2022/0230672 A1* | 7/2022 | Ayyapureddi | ........ | G11C 11/406 |
| 2022/0365889 A1* | 11/2022 | Ayyapureddi | .......... | G06F 13/28 |
| 2023/0161496 A1* | 5/2023 | Jung | ........................ | G11C 7/02 |
| | | | | 711/154 |
| 2023/0206982 A1* | 6/2023 | Kim | .................. | G11C 11/40611 |
| | | | | 365/222 |
| 2024/0079042 A1* | 3/2024 | Ahn | .................. | G11C 11/40611 |
| 2024/0135981 A1* | 4/2024 | Devaux | ............ | G11C 11/40615 |
| 2024/0185910 A1* | 6/2024 | Devaux | .................. | G11C 29/52 |
| 2024/0211344 A1* | 6/2024 | Bains | .................. | G11C 29/028 |

* cited by examiner

MEMORY DEVICE DETECTING WEAKNESS OF OPERATION PATTERN AND METHOD OF OPERATING THE SAME

CROSS-REFERENCE TO RELATED APPLICATIONS

This application claims priority under 35 U.S.C. § 119 to Korean Patent Application Nos. 10-2021-0171202, filed on Dec. 2, 2021, and 10-2022-0052229, filed on Apr. 27, 2022, in the Korean Intellectual Property Office, the disclosures of which are incorporated by reference herein in their entireties.

BACKGROUND

The present disclosure relates to a memory device and a method of operating the same, and more particularly, to a memory device which detects weakness of an operation pattern and a method of operating the same.

Memory devices used in high-performance electronic systems are increasing in integration and speed. In a memory device, such as a dynamic random access memory (DRAM), when access frequency of particular memory cells increases, memory cells adjacent to the particular memory cells may be stressed. As a result, data retention characteristics of the adjacent memory cells are affected, and thus, the data reliability deteriorates. For example, when a particular word line is intensively activated, data retention characteristics of memory cells connected to one or more word lines adjacent to the particular word line may deteriorate, and thus, target refresh may be performed on the one or more word lines adjacent to the particular word line to secure data reliability. A memory device may include components for counting the number of activations regarding a plurality of word lines to control target refresh execution.

However, when a care operation such as a care refresh is performed only by counting the number of activations of word lines, the care operation is actually performed without a detailed determination on the possibility of data loss, and thus the efficiency of utilization of resources of a memory device may deteriorate. For example, a situation in which the number of activations of a particular word line increases may occur not only in a normal memory operation, but also by a malicious attack from the outside. In this regard, a care operation without detailed determination of an operation pattern of a memory device may waste resources of the memory device.

SUMMARY

One or more embodiments provide a memory device capable of detecting weakness of the memory device based on a detailed operation pattern of the memory device and a method of operating the same.

According to an aspect of an embodiment, a method of operating a memory device which includes a plurality of word lines and a register including N entries (N is an integer equal to or greater than 2), is provided. The method includes: storing address information and activation count information regarding N word lines from among the plurality of word lines in the register; based on activation of a first word line different from the N word lines, storing address information and activation count information regarding the first word line in an entry from which information is evicted from among the N entries; and generating first weakness information based on a number of evictions performed on the register during a first period.

According to an aspect of an embodiment, a memory device includes: a memory cell array with a plurality of word lines; a refresh controller configured to control a refresh operation on the plurality of word lines; a control logic circuit configured to store, in a register including N entries (N is an integer equal to or greater than 2), address information and activation count information regarding N word lines from among the plurality of word lines, evict information stored in at least one entry from among the N entries based on activation of a first word line different from the N word lines, and store address information and activation count information regarding the first word line in the at least one entry; and a weakness detection circuit configured to generate first weakness information based on a number of evictions performed on the register during a first period.

According to an aspect of an embodiment, a memory device includes: a memory cell array including a plurality of word lines; a refresh controller configured to control a refresh operation on the plurality of word lines; a control logic circuit configured to store address information and activation count information in a register including N entries (N is an integer equal to or greater than 2) and generate eviction information based on evictions performed on the register; and a weakness detection circuit configured to generate first weakness information corresponding to a first period and second weakness information corresponding to a second period longer than the first period, based on the eviction information. The weakness detection circuit includes: a first current state counter configured to generate and store eviction count information indicating a number of evictions during a current first period; and a first previous state register configured to store eviction count information corresponding to a previous first period. The weakness detection circuit is further configured to generate the first weakness information based on a comparison between the eviction count information corresponding to the current first period and the eviction count information corresponding to the previous first period.

BRIEF DESCRIPTION OF THE DRAWINGS

The above and other aspects and features will be more apparent from the following description of embodiments, taken in conjunction with the accompanying drawings, in which.

DETAILED DESCRIPTION

Embodiments will now be described more fully with reference to the accompanying drawings. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
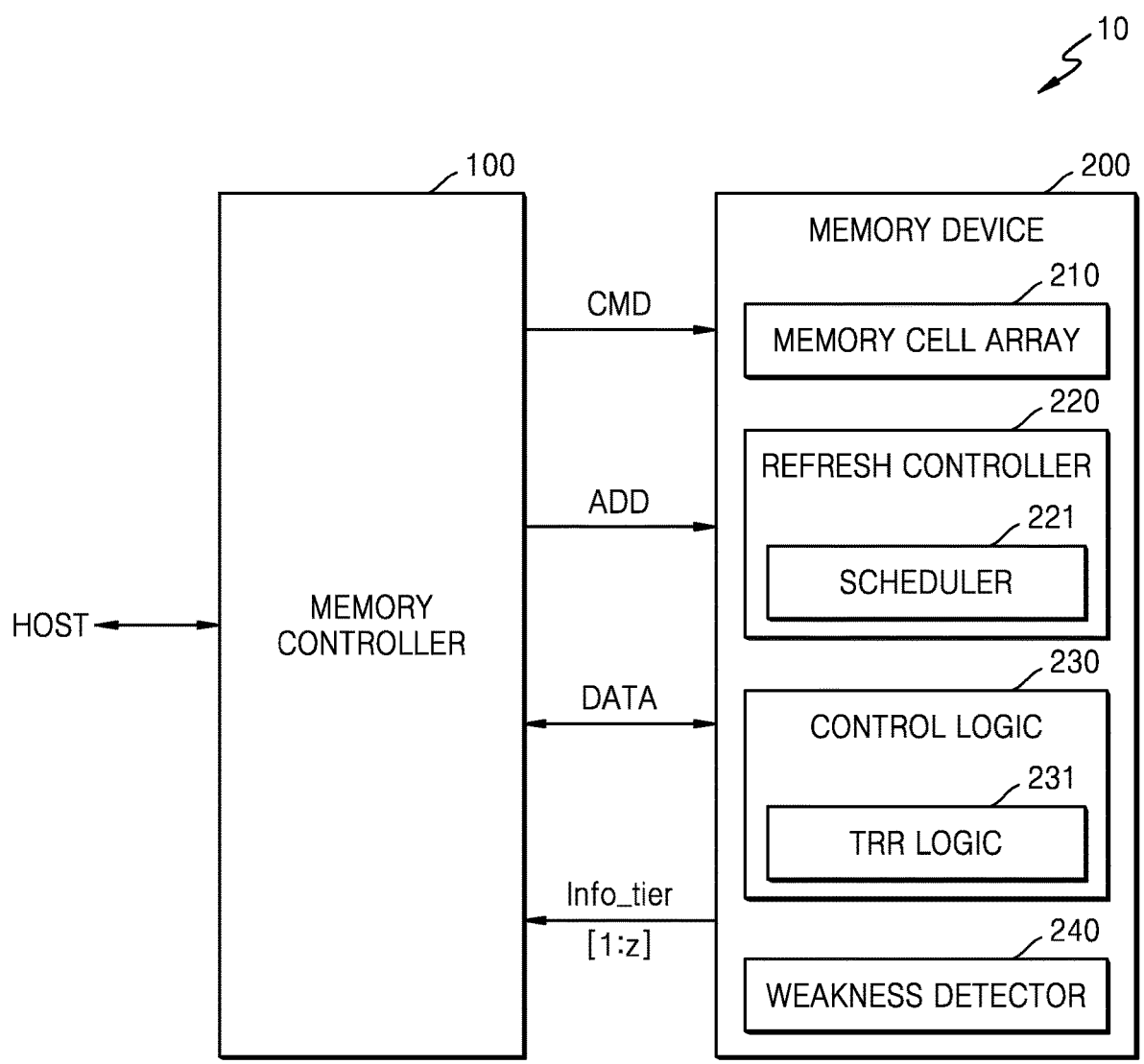
FIG. 1 is a block diagram showing a memory system according to an embodiment.

FIG. 1 is a block diagram showing a memory system according to an embodiment.

Referring to FIG. 1, a memory system 10 may include a memory controller 100 and a memory device 200. The memory device 200 may include a memory cell array 210, a refresh controller 220, a control logic (i.e., control circuitry) 230, and a weakness detector (i.e., weakness detection circuitry) 240. Also, according to an embodiment, the control logic 230 may include a target row refresh (TRR) logic 231. The control logic 230 may further include other components for controlling a memory operation in addition to the TRR logic 231. In this regard, the control logic 230 may be include various types of components in the memory device 200.

The memory controller 100 controls memory operations such as writing and reading by providing various signals to the memory device 200 through an interface circuit. For example, the memory controller 100 may provide a command CMD and an address ADD to the memory device 200 to access data DATA of the memory cell array 210. The command CMD may include a command for a normal memory operation such as data writing and data reading. Also, when the memory device 200 includes dynamic random access memory (DRAM) cells, the command CMD may include commands for various DRAM-related operations, e.g., a refresh command for refreshing memory cells.

The memory controller 100 may access the memory device 200 according to a request from a host HOST. The memory controller 100 may communicate with the host HOST by using various protocols. The memory cell array 210 may include a plurality of memory cells. For example, the memory cell array 210 may include a plurality of word lines, and a plurality of memory cells may be connected to each word line. For example, memory cells connected to one word line may be referred to as a row. In this regard, the memory cell array 210 may include a plurality of rows. Refreshing a word line may indicate refreshing memory cells (or a row) connected to one word line, and thus expressions such as refreshing a word line and refreshing a row may be interchangeably used.

When any one word line is intensively or frequently activated (or accessed) in the memory device 200, memory cells of word lines adjacent to the intensively or frequently activated word line (hereinafter referred to as a 'weak word line') are subjected to electromagnetic interference. In particular, as the degree of integration of the memory device 200 increases, the degree of interference received by the weak word line may increase. Therefore, data of memory cells connected to the weak word line are more likely to be flipped. To secure reliability of data against the flipping, target refreshing may be performed on the weak word line regularly at a certain period or irregularly.

Also, in the memory cell array 210, a plurality of word lines may be arranged side-by-side, and two word lines adjacent to both sides of an intensively accessed word line may respectively correspond to weak word lines. Alternatively, according to an embodiment, as at least two word lines adjacent to one side of an intensively accessed word line correspond to the weak word lines stated above, three or more weak word lines in relation to the intensively accessed word line may be target-refreshed.

In addition, the refresh controller 220 may refresh word lines (or rows) of the memory cell array 210 in response to a refresh command from the memory controller 100. Alternatively, the refresh controller 220 may refresh word lines of the memory cell array 210 without intervention of the memory controller 100 in a self-refresh mode. Also, according to an embodiment, when a particular word line is intensively accessed, the refresh controller 220 may control a target refresh operation performed on one or more weak word lines adjacent to the intensively accessed word line, based on the control of the control logic 230.

According to an embodiment, the TRR logic 231 may perform a logic operation for determining the weak word lines to be refreshed. According to an embodiment, the TRR logic 231 may include a counter for counting the number of activations of a plurality of word lines, determine a word line that is most frequently activated for a certain period based on a result of counting the number of activations of the plurality of word lines, and determine positions of one or more weak word lines adjacent to the most frequently activated word line. Also, address information regarding determined weak word lines may be provided to the refresh controller 220. However, embodiments are not limited thereto, and components for determining weak word lines may be variously implemented in the memory device 200. For example, the components for determining weak word lines may be implemented outside the control logic 230.

The refresh controller 220 may include a circuit (e.g., an address counter) that generates a normal address indicating a word line on which a normal refresh operation is to be performed and may control a normal refresh operation and a target refresh operation, based on a normal address and address information regarding weak word lines from the control logic 230. For example, a normal refresh operation and a target refresh operation may be selectively performed in response to a refresh command from the memory controller 100. For example, the refresh controller 220 may include a scheduler 221, and the scheduler 221 may schedule a normal refresh operation and a target refresh operation.

According to an embodiment, the TRR logic 231 may include a register that stores address information regarding word lines and activation count information related to an activation count of each word line in a table form. Also, a counter circuit for counting activations of word lines may be provided outside the TRR logic 231 or inside the TRR logic 231, and activation count information based on a counting result of the counter circuit may be stored in the register inside the TRR logic 231.

The register of the TRR logic 231 may include a plurality of entries, and each entry may store address information and activation count information regarding any one word line. Also, the number of entries may be less than the number of word lines included in the memory cell array 210, and thus, address information and activation count information regarding some of the word lines included in the memory cell array 210 may be stored in the register of the TRR logic 231. When another word line is activated after information is stored in all entries of the register, information in any one entry in the register may be evicted and address information and activation count information regarding a newly activated word line may be stored in the corresponding entry. As used herein, eviction may indicate deletion of information stored in an entry, and it may be stated that an entry is evicted or information of an entry is evicted.

According to an embodiment, the TRR logic 231 may include a component that provides eviction information every time an eviction occurs in an entry. For example, the TRR logic 231 may include a counter circuit (hereinafter, referred to as an eviction counter circuit) that provides a counted value of 1 in response to an eviction of an entry. The TRR logic 231 may provide eviction information that may indicate a frequency of eviction of the register in various forms according to embodiments. For example, the TRR logic 231 may provide eviction information having a value of 1 every time any one entry is evicted or may provide eviction information having a value of 2 or greater when some entries are evicted with a weight applied to an eviction characteristic. Alternatively, according to an embodiment, the TRR logic 231 may provide a value obtained by cumulatively counting the number of evictions of an entry during a certain set period as the eviction information described above. According to embodiments, it is not necessary to limit the characteristics of eviction information that may be provided by the TRR logic 231 to a particular form.

According to an embodiment, the weakness detector 240 may detect a weakness of the memory device 200 based on eviction information from the control logic 230 or the TRR logic 231 and output weakness information Info_tier[1:Z] indicating the weakness. For example, when the word lines of the memory device 200 are frequently activated, the frequencies of evictions of entries may increase. In this case, as activation count information stored in the entries is lost, the probability that data of weak word lines that need to be target-refreshed is flipped may increase. Also, when the word lines are frequently activated during a normal operation of the memory device 200, the possibility of data flipping may be relatively low. However, when word lines are frequently activated and frequencies of evictions of entries increase due to a malicious external attack, data retention characteristics of weak word lines may deteriorate, and thus, data of the weak word lines is highly likely flipped.

According to an embodiment, the weakness detector 240 may determine an operation state and/or an operation pattern of the memory device 200 based on eviction information from the TRR logic 231, may detect a weakness related to data loss of the memory device 200 based on the operation state and/or the operation pattern, and output the weakness information Info_tier[1:Z] according to the weakness. For example, the weakness of the memory device 200 may be classified into a plurality of stages of tiers according to eviction frequencies of entries, and the tier of the weakness information Info_tier[1:Z] may increase when the weakness of the memory device 200 increases as the frequencies of evictions of entries increase.

According to an embodiment, based on a counting operation of the eviction counter circuit of the TRR logic 231 for a certain period (e.g., a first period), information regarding the number of evictions performed on entries during the first period may be provided to the weakness detector 240. Alternatively, the TRR logic 231 may provide a value of 1 or greater as eviction information to the weakness detector 240 every time an eviction is performed on entries, and the weakness detector 240 may count the eviction information to determine the number of evictions performed on the entries for the first period.

According to an embodiment, the weakness of the memory device 200 may be detected by comparing the number of evictions during a previous first period with the number of evictions during a current first period. For example, when the number of evictions in the current first period is greater than the number of evictions in the previous first period (or greater than the number of evictions in the previous first period by at least a certain threshold), the weakness detector 240 may determine that the weakness of the memory device 200 has increased, and thus, the tier of the weakness information Info_tier[1:Z] may increase. On the other hand, when the number of evictions in the current first period is less than the number of evictions in the previous first period, the weakness detector 240 may determine that the weakness of the memory device 200 has decreased, and thus, the tier of the weakness information Info_tier[1:Z] may decrease. In this regard, the weakness information Info_tier[1:Z] may be updated, such that the tier of the weakness information Info_tier[1:Z] increases or decreases over time.

According to an embodiment, the weakness of the memory device 200 may be detected for each of a plurality of periods, and, when Z periods are defined, the weakness information Info_tier[1:Z] may include Z pieces of weakness information. For example, as Z periods are defined, the number of evictions may be determined for each of the Z periods based on the counting operation of the TRR logic 231 and/or the weakness detector 240, and the weakness detector 240 may generate the weakness information Info_tier[1:Z] indicating weaknesses in the Z periods.

For example, as a second period longer than the first period is defined, when the second period corresponds to a time period including a plurality of first periods, based on the counting operation of the weakness detector 240, the number of actual evictions of entries in the second period may be determined by cumulatively counting the numbers of actual evictions in the plurality of first periods. Alternatively, according to various embodiments, the weakness detector 240 may perform a counting operation by 1 when the number of evictions of entries in each first period is greater than a certain threshold value, and thus, a result of cumulatively counting the value of 1 in the plurality of first period corresponding to the second period may be used as the number of evictions in the second period. According to an embodiment, the weakness of the memory device 200 in the second period may also be detected by comparing the number of evictions during a previous second period with the number of evictions during a current second period.

Moreover, the weakness information Info_tier[1:Z] may be used inside the memory controller 100 and/or the memory device 200, and, based on the weakness information Info_tier[1:Z], a care operation for improving data retention characteristics may be performed. For example, when the possibility of data loss is high due to a high weakness of the memory device 200, the frequency of performing a refresh operation may be increased by setting the period of the refresh operation to be short. Also, a control operation may be performed to selectively perform or selectively not perform a target refresh operation based on the weakness of the memory device 200. Alternatively, various care operations such as adjusting the frequency of performing a target refresh operation according to the degree of the weakness of the memory device 200 may be performed.

Also, because a degree of weakness during a relatively short period and a degree of weakness during a relatively long period may be detected, a care operation may be performed in consideration of a period in which a weakness is determined. For example, when the weakness of the memory device 200 is significantly increased over a relatively short period, a control operation for temporarily delaying or skipping a memory operation (e.g., an operation including an activation) to reduce high frequencies of evictions of entries may be performed. For example, the memory controller 100 or the memory device 200 may control the access delay/skip. For example, in response to a request from a host, the memory controller 100 may delay and output the active command or the memory device 200 may delay the generation timing of the internal active signal. Also, in relation to the request from the host, the memory controller 100 may respond to an access failure to the host, thereby skipping the access request from the host. Also, when the weakness of the memory device 200 is significantly increased over a relatively long period, a control operation for setting a short refresh period may be performed to improve overall data retention characteristics for a long period of time.

Moreover, the memory device 200 may include DRAM such as double data rate synchronous dynamic random access memory (DDR SDRAM), low power double data rate LPDD (LPDDR) SDRAM, graphics double data rate (GDDR) SDRAM, Rambus dynamic random access memory (RDRAM), etc. However, embodiments are not limited thereto. For example, embodiments may be applied to a memory device that performs a data retention operation corresponding to a refresh operation and includes a non-volatile memory such as magnetic RAM (MRAM), ferroelectric RAM (FeRAM), phase change RAM (PRAM), and resistive RAM (ReRAM).

Moreover, the memory device 200 may include one memory chip or may include a semiconductor package including two or more memory chips. Alternatively, the memory device 200 may include a memory module in which a plurality of memory chips are mounted on a module board. Alternatively, although FIG. 1 shows that the memory controller 100 and the memory device 200 are separate components, the memory device 200 may also be implemented as a memory system in which a memory control function and a memory cell array are integrated in a single semiconductor package.

Also, although it has been described that the weakness of the memory device 200 is determined based on the number of evictions of entries, embodiments are not limited thereto. According to an embodiment, weakness may be determined through various methods based on activations of word lines. For example, weakness may be determined by counting the total number of activations during a certain period or counting the number of word lines activated during a certain period, and information used for determining weakness according to embodiments may also be defined as information regarding activation frequencies.

Figure 2:
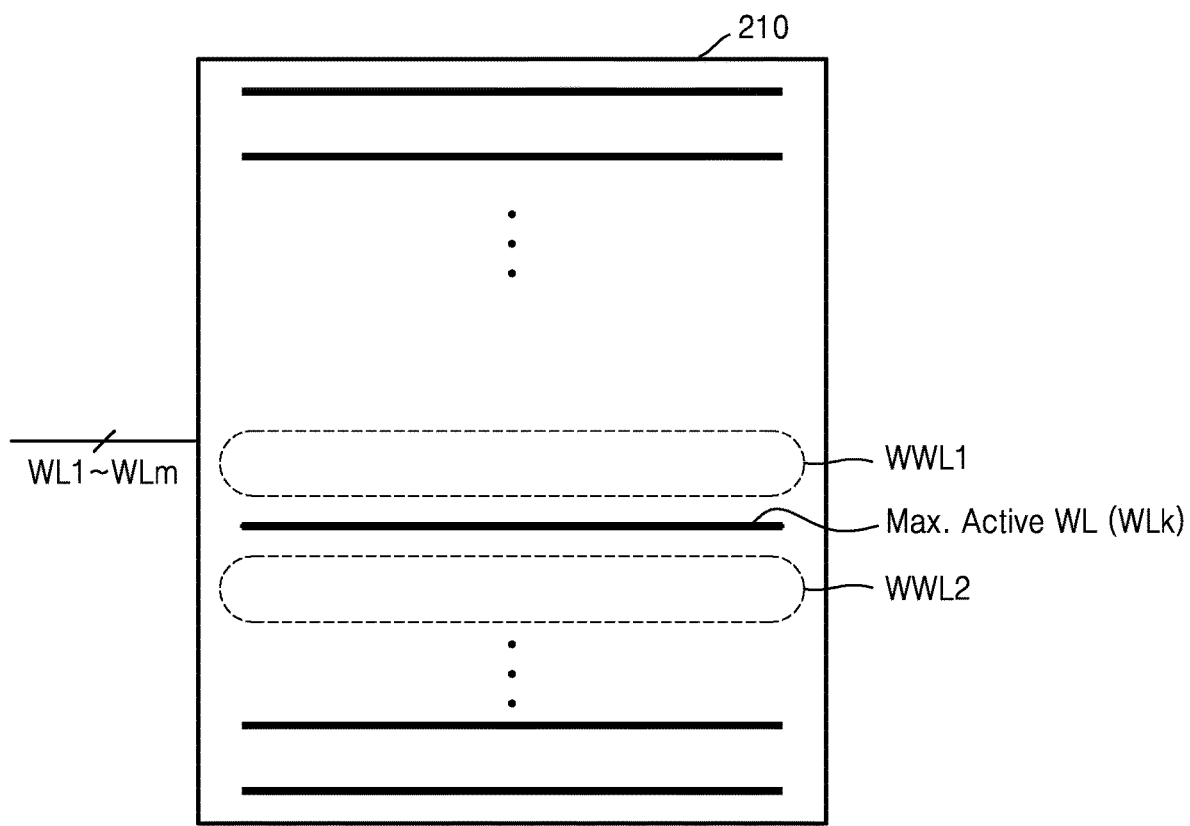
FIG. 2 is a diagram showing an example of determining a weak word line based on the number of activations regarding word lines according to an embodiment.

FIG. 2 is a diagram showing an example of determining a weak word line based on the number of activations regarding word lines. For example, counting of the number of activations and determination of a weak word line may be performed based on an operation of a TRR logic.

Referring to FIGS. 1 and 2, the memory cell array 210 includes a plurality of word lines WL1 to WLm, and, based on a result of counting activations of the plurality of word lines WL1 to WLm according to a certain period, the most frequently activated word line from among the plurality of word lines WL1 to WLm may be determined. When a k-th word line WLk is the most frequently activated word line, at least one word line adjacent to the k-th word line WLk may be significantly affected by electromagnetic interference, and thus the at least one word line adjacent to the k-th word line WLk may correspond to a weak word line.

Weak word lines may be positioned on both sides of the k-th word line WLk. For example, at least one weak word line positioned on one side of the k-th word line WLk may be referred to as a first weak word line WWL1, and at least one weak word line positioned on the other side may be referred to as a second weak word line WWL2. Also, when performing a target refresh operation, the target refresh operation may be performed on the first weak word line WWL1 and the second weak word line WWL2 according to a certain set period.

According to an embodiment, as the number of entries of the register provided in the TRR logic 231 is less than the number of word lines WL1 to WLm, address information regarding a portion of the plurality of word lines WL1 to WLm and activation count information corresponding to the portion of the plurality of word lines WL1 to WLm may be stored in the entries. Also, when another word line of which address information is not stored in the entries is newly activated, information stored in any one of the entries may be evicted, and address information and activation count information regarding the newly activated word line may be stored in the evicted entry. When an eviction operation as described above is performed for a plurality of number of times, as activation count information regarding at least some of the plurality of word lines WL1 to WLm is deleted from the register, the accuracy of information including activation counts of word lines may decrease, and thus, the reliability of data may deteriorate.

On the other hand, according to embodiments, frequencies of evictions of information of entries may be determined based on the operation of the TRR logic 231, and a weakness of the memory device 200 may be detected based on the determination of the frequencies of evictions. Therefore, the reliability of data may be further improved through a care operation for the memory device 200 according to the degree of a detected weakness.

Figure 3:
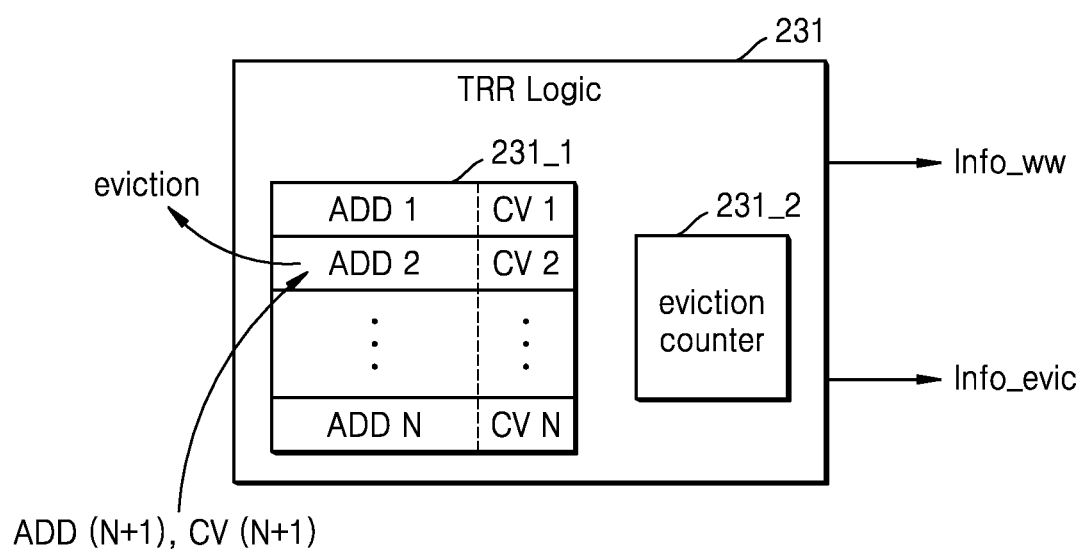
FIG. 3 is a block diagram showing a target row refresh (TRR) logic according to an embodiment.

FIG. 3 is a block diagram showing a TRR logic according to an embodiment.

Referring to FIGS. 1 to 3, the TRR logic 231 may include a register 231_1 and an eviction counter circuit 231_2, and the register 231_1 may include N entries. As discussed above with respect to FIG. 2, the number of N entries may be less than the number of word lines WL1 to WLm (N<m), and address information and activation count information regarding N word lines may be stored in the register 231_1. For example, when address information ADD 1 to ADD N regarding N word lines is stored, first to N-th activation count information CV 1 to CV N corresponding to the N word lines may be stored in the register 231_1.

When an (N+1)-th word line is newly activated, information regarding the (N+1)-th word line is not stored in the N entries of the register 231_1. Therefore, information stored in any one of the N entries of the register 231_1 may be evicted, and information regarding the (N+1)-th word line may be stored in the evicted entry. An entry from which information is evicted may be arbitrarily selected or may be selected according to a certain criterion (e.g., an entry in which information regarding a word line having the smallest activation count is stored). FIG. 3 shows a case in which information regarding a second word line is evicted. In this regard, address information ADD 2 regarding the second word line and second activation count information CV 2 corresponding thereto may be evicted from an entry, and address information ADD (N+1) regarding the (N+1)-th word line and (N+1)-th activation count information CV (N+1) corresponding thereto may be newly stored in the entry.

In addition, the eviction counter circuit 231_2 may output eviction information Info_evic as evictions are performed in entries of the register 231_1. Also, as described above, the TRR logic 231 may output information regarding the most frequently activated word line (or weak word line information Info_ww) for a certain period. According to an embodiment, the weak word line information Info_ww may be used to perform a target refresh operation, and the eviction information Info_evic may be used to detect a weakness of the memory device 200.

Figure 4:
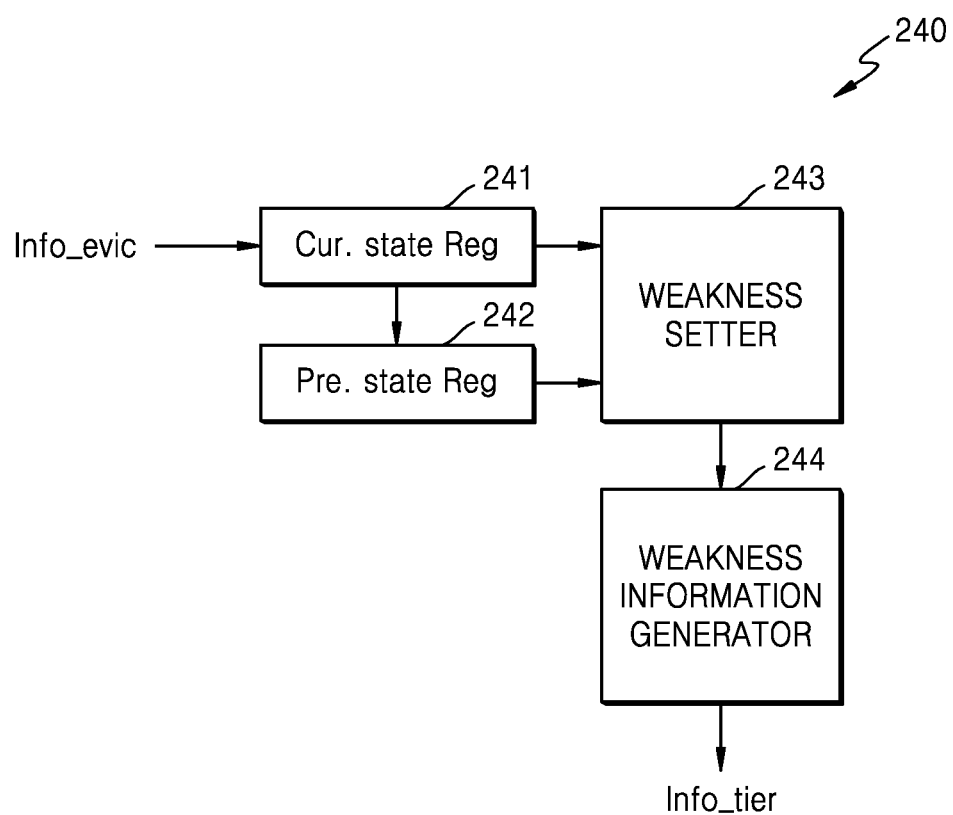
FIG. 4 is a block diagram showing a weakness detector of FIG. 1 according to an embodiment.

FIG. 4 is a block diagram showing the weakness detector of FIG. 1 according to an embodiment.

Referring to FIGS. 1 to 4, the weakness detector 240 may detect a weakness of the memory device 200 based on the eviction information Info_evic from the control logic 230 or the TRR logic 231 and output weakness information Info_tier according to the weakness. According to an embodiment, the weakness detector 240 may include a current state register 241, a previous state register 242, a weakness setter 243, and a weakness information generator 244. Because one or both of the current state register 241 and the previous state register 242 may perform a counting function, the current state register 241 and the previous state register 242 may also be respectively referred to as a current state counter and a previous state counter.

The weakness detector 240 may receive the eviction information Info_evic output from the TRR logic 231 for a certain first period and provide the eviction information Info_evic to the current state register 241. A value obtained by counting the number of evictions for the first period may be provided from the TRR logic 231 to the current state register 241 as the eviction information Info_evic. Alternatively, the number of evictions during the first period may be counted as the current state register 241 counts the number of evictions every time entries are evicted during the first period, and the number of evictions during the first period may be stored in the current state register 241. Also, in a next first period, the weakness detector 240 may receive the eviction information Info_evic again, and eviction count information regarding the previous first period may be moved to the previous state register 242, and eviction count information regarding a current first period may be stored in the current state register 241.

The weakness setter 243 may determine a weakness based on information stored in the current state register 241 and the previous state register 242, and may perform a weakness setting operation based on the determined weakness. For example, the weakness setter 243 may compare the number of evictions in the current first period with the number of evictions in the previous first period and, when the number of evictions in the current first period is greater than the number of evictions in the previous first period, may determine that the weakness of the memory device 200 has increased. Alternatively, the weakness setter 243 may determine that the weakness of the memory device 200 has increased when the number of evictions in the current first period is equal to or greater than the number of evictions in the previous first period by at least a threshold value.

The weakness information generator 244 may include table information including a plurality of tiers according to degrees of weakness, and, based on the setting of the weakness setter 243, any one of the plurality of tiers may be output as the weakness information Info_tier. For example, the weakness information generator 244 may output the weakness information Info_tier in which the tier is increased by one step when the weakness has increased as the number of evictions in the current first period is greater than the number of evictions in the previous first period.

On the other hand, although an embodiment in which the degree of weakness is adjusted by comparing the number of evictions in a previous period with the number of evictions in a current period has been described above, embodiments are not limited thereto. For example, by comparing the number of evictions periodically determined in each first period with a certain threshold value, every time the number of evictions is greater than the threshold value, the weakness detector 240 may determine that the weakness has increased.

Figure 5:
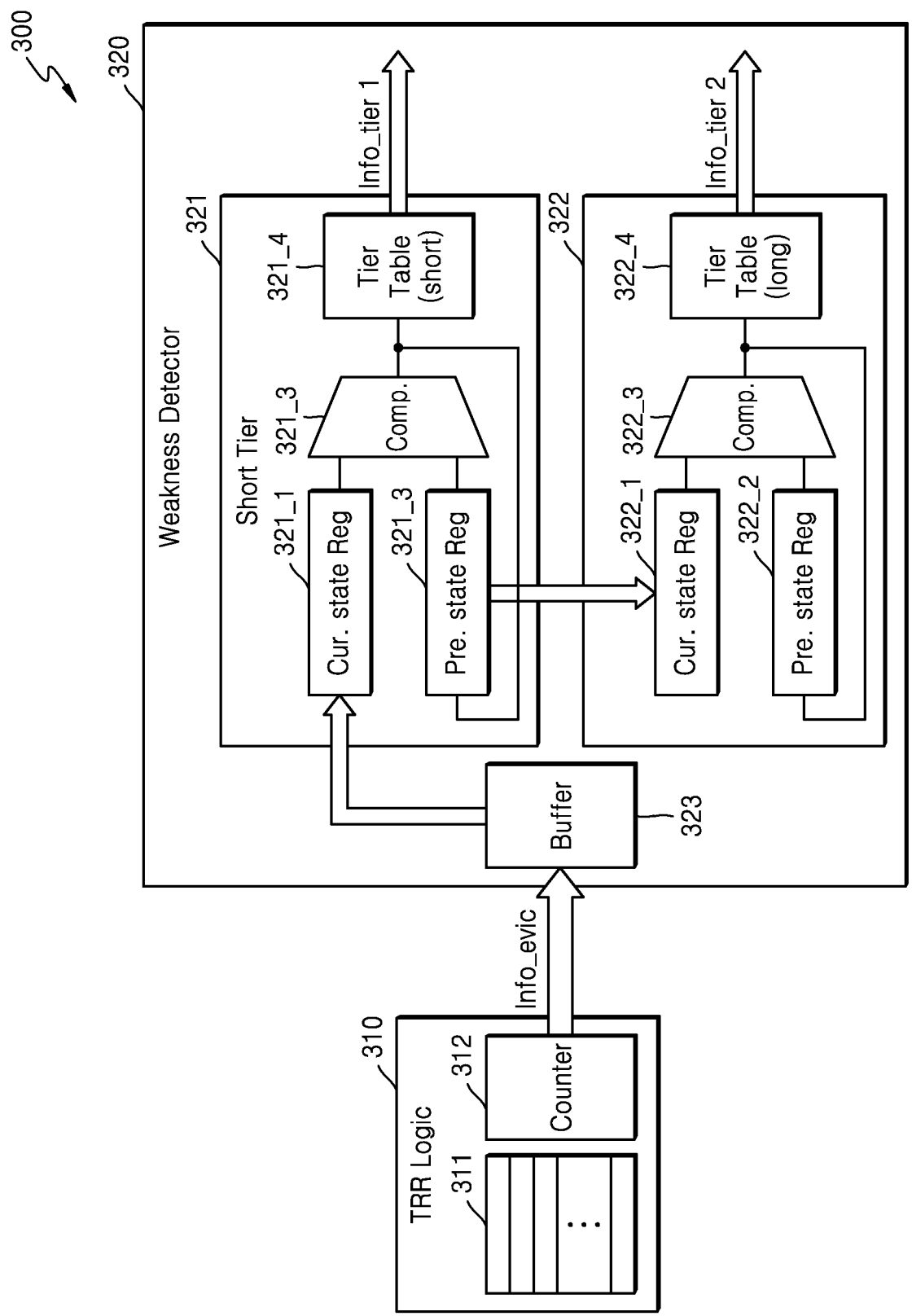
FIG. 5 is a block diagram showing a memory device according to an embodiment.

FIG. 5 is a block diagram showing a memory device according to an embodiment. FIG. 5 shows an a TRR logic 310 and a weakness detector 320 provided in a memory device 300, according to an embodiment. Also, in FIG. 5, a first period short corresponding to a relatively short time period and a second period long corresponding to a relatively long time period are defined, and a case in which weakness information is generated in each of the first period short and the second period long is exemplified.

Referring to FIG. 5, the memory device 300 may include the TRR logic 310 and the weakness detector 320, and circuits constituting the TRR logic 310 and the weakness detector 320 may be arranged inside the memory device 300 in various ways. For example, at least some of the components provided in the TRR logic 310 and the weakness detector 320 may be provided in the control logic described above.

The TRR logic 310 may include a register 311 and an eviction counter circuit 312, and the register 311 may include a number of entries. As a plurality of word lines of the memory device 300 are activated, address information and activation count information regarding some of the plurality of word lines may be stored in entries of the register 311, and, when a new word line is activated while all of the entries are being used, eviction for deleting information stored in at least one of the entries of the register 311 may be performed. The eviction counter circuit 312 may output the eviction information Info_evic by performing a counting operation in response to evictions performed on the entries of the register 311.

The weakness detector 320 may include a first weakness detector 321, a second weakness detector 322, and a buffer 323, and the first weakness detector 321 may include a first current state register 321_1, a first previous state register 321_2, a first weakness setter 321_3, and a first weakness information generator 321_4. Similarly, the second weakness detector 322 may include a second current state register 322_1, a second previous state register 322_2, a second weakness setter 322_3, and a second weakness information generator 322_4. According to an embodiment, because the first weakness setter 321_3 and the second weakness setter 322_3 may each perform a comparison operation, it may be described that the first weakness setter 321_3 and the second weakness setter 322_3 each include a comparator and the first weakness information generator 321_4 and the second weakness information generator 322_4 each include a table in which a plurality of tiers are stored.

The eviction information Info_evic from the TRR logic 310 may be provided to the first current state register 321_1 through the buffer 323. Also, eviction count information regarding entries in a certain first period may be stored in the first current state register 321_1, eviction count information in a previous first period may be moved in the first previous state register 321_2, and eviction count information in a current first period may be updated in the first current state register 321_1.

According to an embodiment, the first weakness setter 321_3 may perform an operation of comparing the number of evictions in the previous first period with the number of evictions in the current first period and may perform a setting operation for the first weakness information generator 321_4 based on a result of the comparison. For example, the first weakness information generator 321_4 may output any one selected from among a plurality of tiers based on the setting of the first weakness setter 321_3 as first weakness information Info_tier 1.

According to an embodiment, the weakness detector 320 may output the first weakness information Info_tier 1 indicating a weakness in a relatively short first period and second weakness information Info_tier 2 indicating a weakness in a relatively long second period. According to an embodiment, eviction count information may be provided to the second weakness detector 322 in each of a plurality of first periods, and the second weakness detector 322 may determine eviction characteristics in entries of the register 311 during a second period corresponding to a time period including the plurality of first periods. For example, eviction count information stored in the first previous state register 321_2 in each of the plurality of first periods may be provided to the second current state register 322_1.

According to an embodiment, as the numbers of evictions in the plurality of first periods are cumulatively counted, the second current state register 322_1 may store eviction count information corresponding to the number of actual evictions of entries in the second period. Alternatively, a value obtained by counting 1 every time the number of evictions of entries in each of the first periods is greater than a certain threshold value may be accumulated in the second current state register 322_1. In this regard, the weakness detector 320 may determine whether the number of evictions of entries in a second period has increased or decreased according to a result of accumulating values obtained by counting 1 through a plurality of first periods in the second current state register 322_1.

Also, information stored in the second current state register 322_1 (hereinafter, referred to as eviction count information) every second period may be moved to the second previous state register 322_2. The second weakness detector 322 may output the second weakness information Info_tier 2 in a similar manner to the first weakness detector 321 described above. For example, the second weakness setter 322_3 may perform an operation of comparing the number of evictions in a previous second period with the number of evictions in a current second period and may perform a setting operation for the second weakness information generator 322_4 based on a result of the comparison. For example, the second weakness information generator 322_4 may output any one selected from among a plurality of tiers based on the setting of the second weakness setter 322_3 as second weakness information Info_tier 2.

Figure 6:
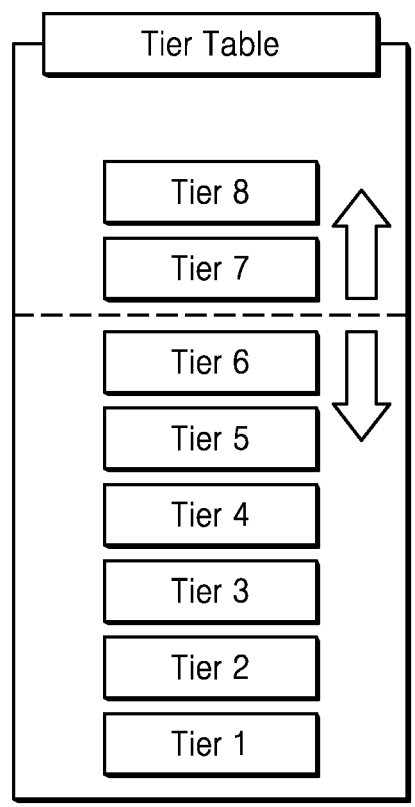
FIG. 6 is a block diagram showing a tier table shown in FIG. 5, according to an embodiment.

FIG. 6 is a block diagram showing a tier table shown in FIG. 5, according to an embodiment. According to an embodiment, the first weakness information generator 321_4 and the second weakness information generator 322_4 may be implemented identically, and the tier table of FIG. 6 may be a component provided in each of the first weakness information generator 321_4 and the second weakness information generator 322_4. As shown, the Tier Table may include eight tiers, Tier 1 through Tier 8. For example, Tie 1 may be the lowest tier indicating the lowest weakness level, and Tier 8 may be the higher tier indicating the highest weakness level.

When the tier table of FIG. 6 is a component provided in the first weakness information generator 321_4 of FIG. 5, a tier increases or decreases and is selected based on the setting of the first weakness setter 321_3, and a selected tier may be output as the first weakness information Info_tier 1. For example, based on information stored in the first current state register 321_1 and the first previous state register 321_2, when the number of evictions in a current first period is greater than the number of evictions in a previous first period, the tier may increase. On the contrary, when the number of evictions in the current first period is less than the number of evictions in the previous first period, the tier may decrease.

Similarly, in the case of the operation of the second weakness detector 322, based on the information stored in the second current state register 322_1 and the second previous state register 322_2, when the number of evictions in a current second period is greater than the number of evictions in a previous second period, the tier may increase. On the contrary, when the number of evictions in the current second period is less than the number of evictions in the previous second period, the tier may decrease.

According to an embodiment, various policies may be applied for increasing or decreasing a tier. For example, to prevent frequent changes of the tier, the tier may increase or decrease only when the number of evictions in the current first period is greater or less than the number of evictions in the previous first period by at least a certain threshold value. Also, determination of a weakness corresponding to a fairly high indicator (e.g., tier 7 or higher) may be limited to a case in which the number of evictions in the current first period rapidly increases. In this case, a criterion for determining to increase the tier to tier 7 or a higher tier may be set differently from other cases. For example, even when the number of evictions in the current first period is greater than the number of evictions in the previous first period, when the number of evictions in the current first period is not greater than the number of evictions in the previous first period by at least a certain threshold value, the tier may be managed to not to increase to a tier higher than 7.

Figure 7:
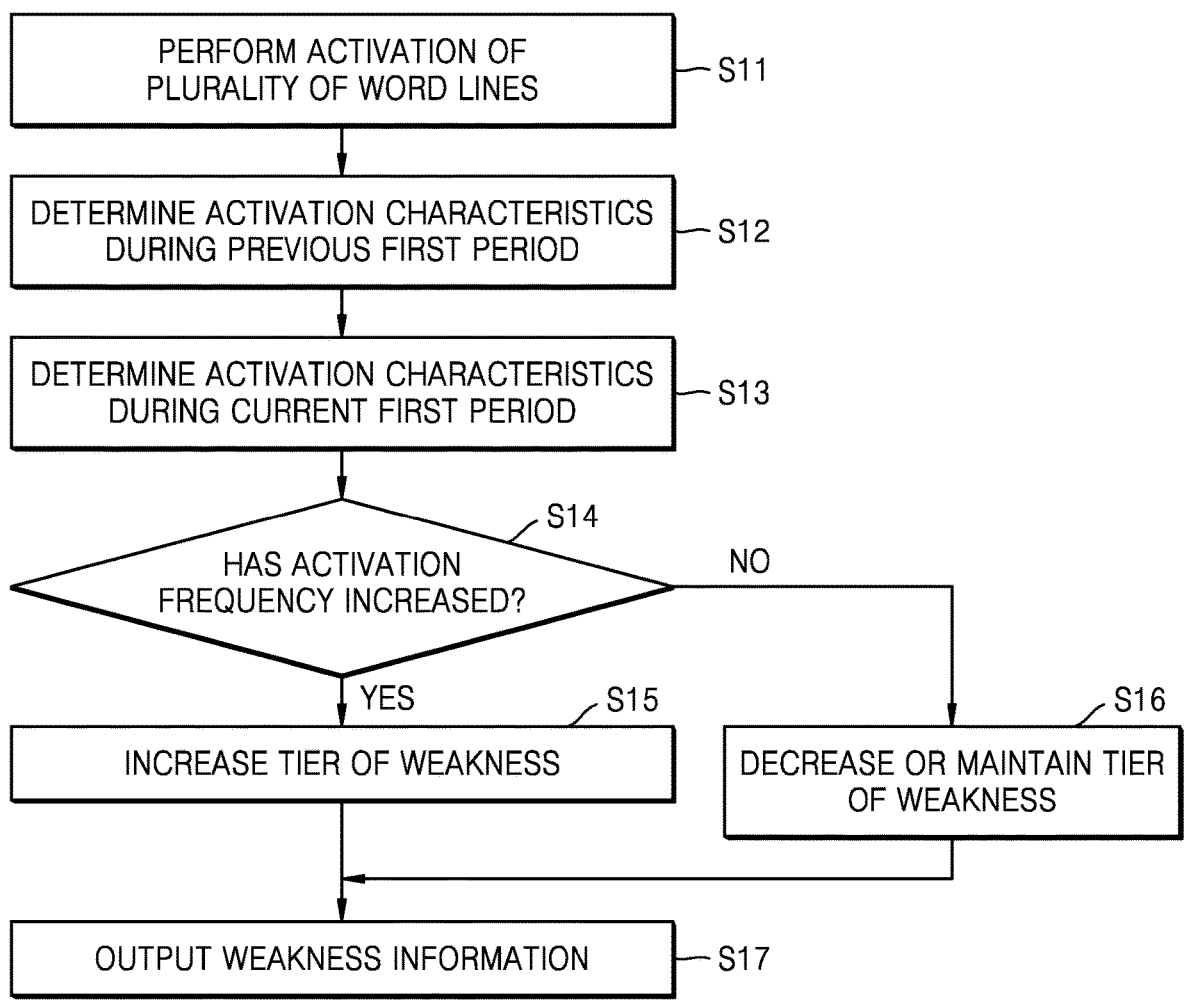
FIGS. 7 and 8 are flowcharts of a method of operating a memory system, according to embodiments.
Figure 8:
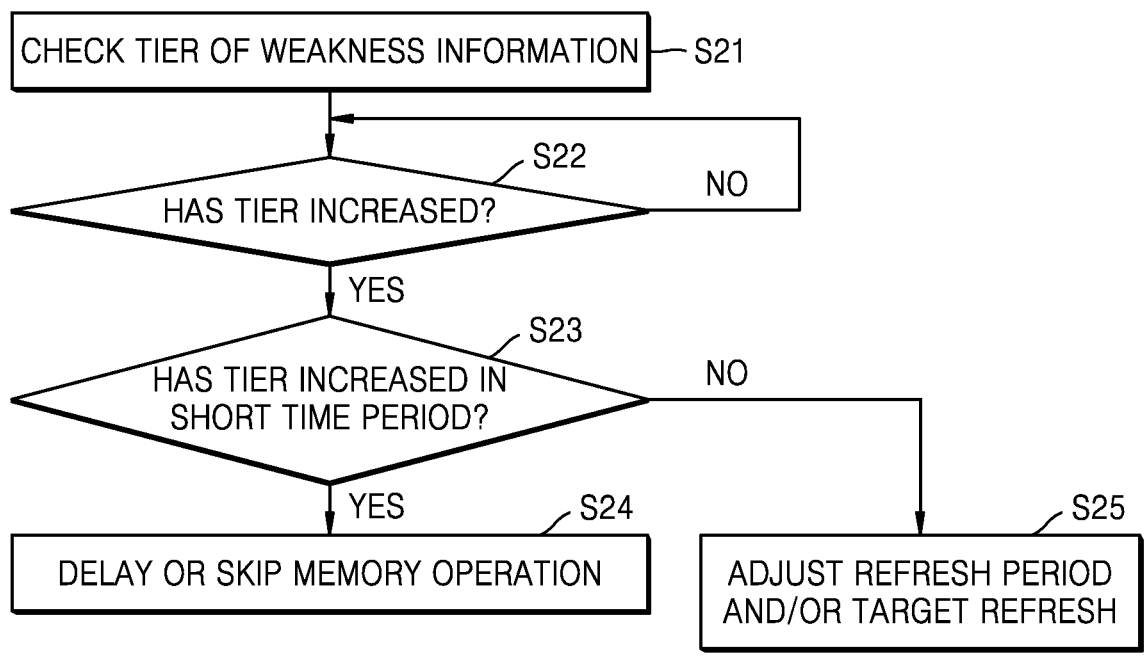

FIGS. 7 and 8 are flowcharts of a method of operating a memory system, according to embodiments. The subject of performing each of the operations shown in FIGS. 7 and 8 may be a memory device or a memory controller (or an application processor).

Referring to FIG. 7, as various memory operations are performed on a memory device, an activation operation may be performed on a plurality of word lines (operation S11), and a counter circuit provided in the memory device may count the number of activations of the plurality of word lines. Also, a register provided in the memory device may include a plurality of entries, and address information and activation count information regarding some of the plurality of word lines provided in the memory device may be stored in the entries.

One or more periods for determining the weakness of the memory device may be defined. For example, as an activation characteristic of the word lines is determined for each of a plurality of first periods, the activation characteristics of the word lines during a previous first period may be determined (operation S12), and the activation characteristic of the word lines during a current first period may be determined (operation S13). The activation characteristic may be a criterion for determining an operation pattern or an operation characteristic of a memory device, e.g., the total number of activations performed during a first period. Alternatively, the activation characteristic may be defined as the number of word lines on which activation is performed at least once during a first period, or the activation characteristic may be defined as information obtained by counting the number of evictions for a plurality of entries according to embodiments described above. Because the number of evictions of entries may increase when activation frequencies of word lines increase, it will be described below that the activation characteristic corresponds to an activation frequency.

It may be determined whether an activation frequency during the current first period has increased as compared to an activation frequency during the previous first period (operation S14), and, when the activation frequency has increased, weakness information in which the tier of the weakness is increased may be generated (operation S15). On the other hand, when the activation frequency has not increased, weakness information in which the tier of the weakness is maintained or decreased may be generated (operation S16). Weakness information generated or updated as described above may be stored in a storage circuit inside the memory device, and the weakness information may be utilized inside the memory device or used by an external device. For example, the weakness information may be provided to an application processor including a memory controller (operation S17).

Referring to FIG. 8, the weakness information stored in the memory device may be utilized inside the memory device or provided to the memory controller, and the memory device or the memory controller may check the tier of the weakness through the weakness information (operation S21). As a result of the checking, it may be determined whether the tier of the weakness information has increased as compared to a previous period (e.g., a relatively short first period or a relatively long second period) (operation S22).

When the tier of the weakness has increased, it may be determined whether the increase of the tier corresponds to an increase of the tier in a short time period (the first period) (operation S23). According to an embodiment, when the tier of the weakness increases, a care operation corresponding to the increase of the tier of the weakness may be performed, wherein care operations performed in a case where the tier of the weakness increases in a first period and a case where the tier of the weakness increases in a second period may differ. When the tier has increased over a short time period, a delay or a skip may be applied to a memory operation, such that high activation frequencies of word lines may be reduced (operation S24). On the other hand, when the tier has increased over a long time period, to secure the reliability of data of the memory device in a relatively long period, a refresh frequency may be increased by reducing a refresh period or increasing a frequency of performing target refresh operations (operation S25), thereby securing the reliability of data.

Figure 9:
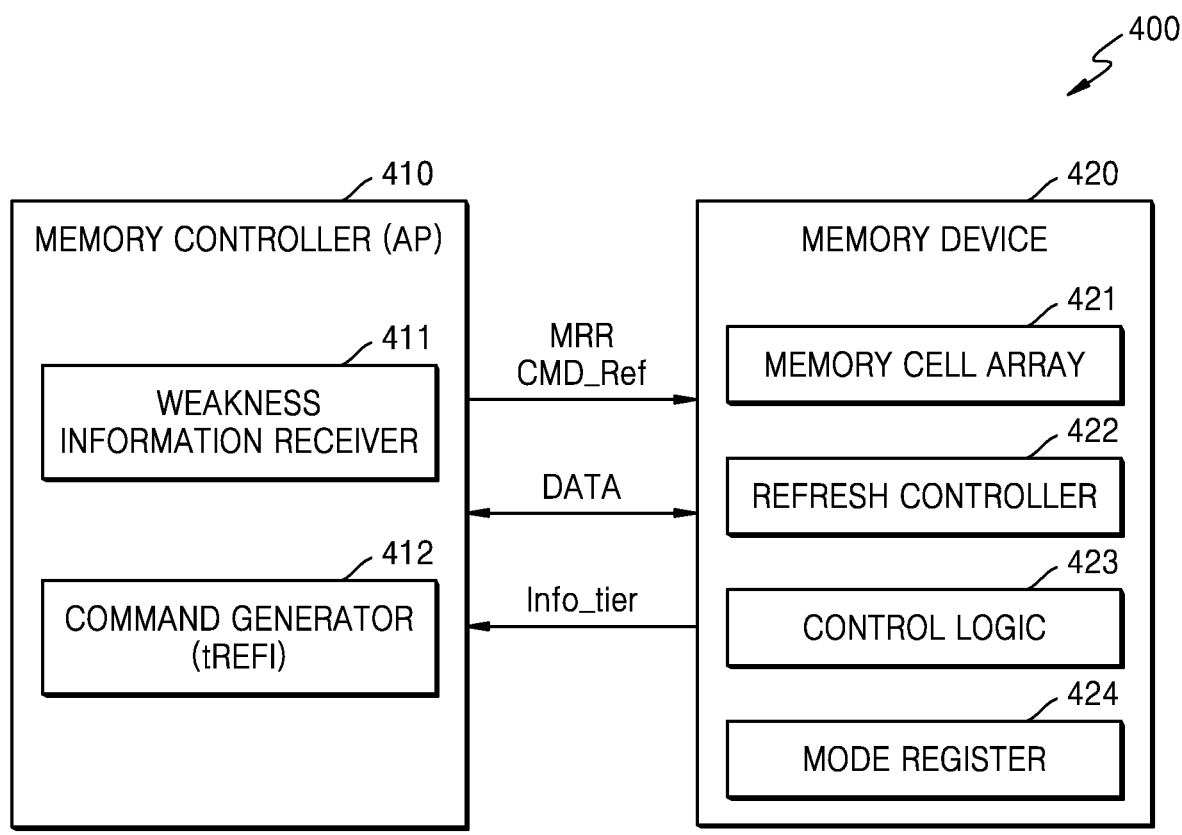
FIGS. 9 and 10 are block diagrams of a memory system showing examples of utilization of weakness information.
Figure 10:
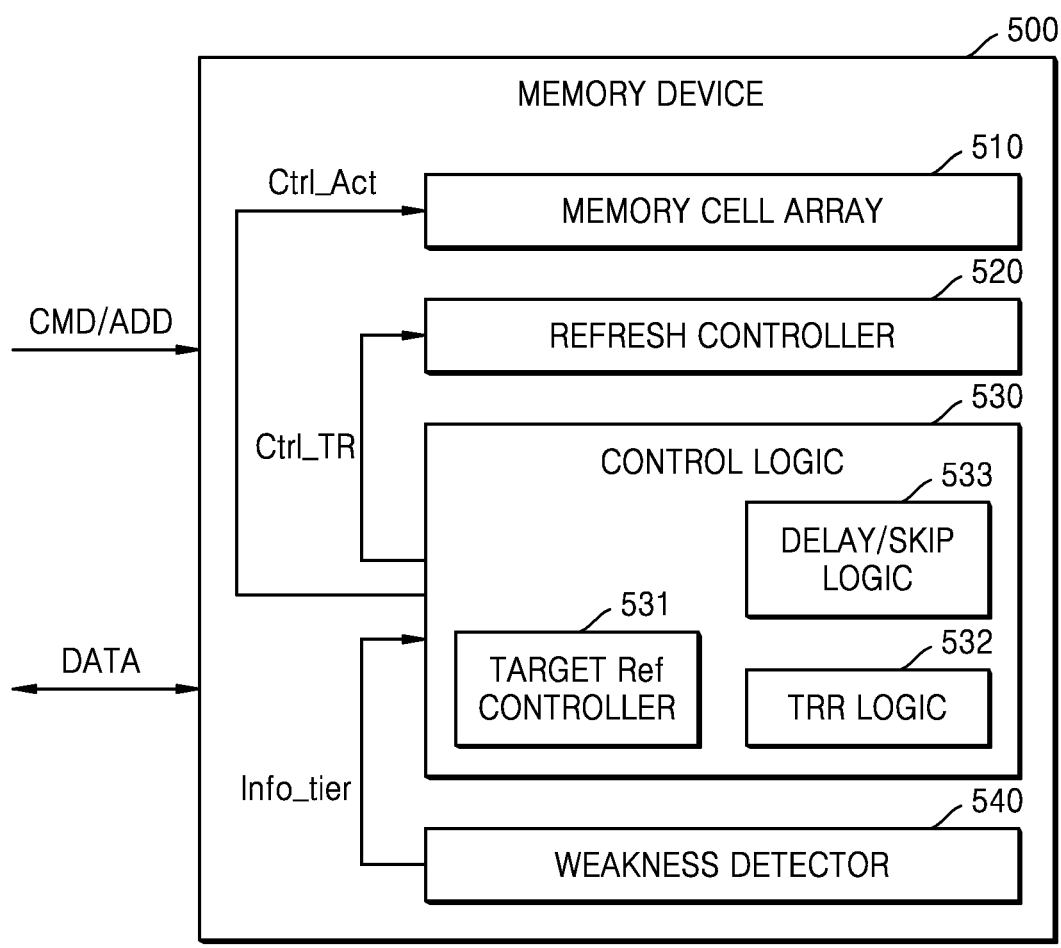

FIGS. 9 and 10 are block diagrams of a memory system showing examples of utilization of weakness information. FIG. 9 illustrates an example in which weakness information is provided from a memory device to a memory controller, and FIG. 10 illustrates an example in which weakness information is utilized inside a memory device.

Referring to FIG. 9, a memory system 400 may include a memory controller 410 and a memory device 420, and the memory controller 410 may include a weakness information receiver 411 and a command generator 412. Also, the memory device 420 may include a memory cell array 421, a refresh controller 422, a control logic 423, and a mode register 424. Also, the memory device 420 may further include a weakness detector.

According to an embodiment, the memory controller 410 may be a component included in an application processor, and the application processor may be implemented as a system-on-chip (SoC). The SoC may include a system bus to which a predetermined standard bus protocol is applied and may include various intellectual property (IP) blocks connected to the system bus. For example, an IP block may include circuitry to perform specific functions and may have a design that includes a trade secret. As a standard protocol for the system bus, protocols such as the advanced microcontroller bus architecture (AMBA) protocol of Advanced RISC Machine (ARM) may be applied. The types of a bus of the AMBA protocol may include Advanced High-Performance Bus (AHB), Advanced Peripheral Bus (APB), Advanced eXtensible Interface (AXI), AXI4, AXI Coherency Extensions (ACE), etc. Also, other types of protocols such as uNetwork of SONICs Inc., CoreConnect of IBM, and Open Core Protocol of OCP-IP may be applied.

The weakness information Info_tier generated by the memory device 420 according to embodiments described above may be stored in the mode register 424. The command generator 412 of the memory controller 410 may output a mode register read command MRR for reading information stored in the mode register 424 to the memory device 420 and may receive the weakness information Info_tier in response to the mode register read command MRR. According to an embodiment, the weakness information Info_tier may be transmitted through a data channel between the memory controller 410 and the memory device 420.

The memory controller 410 may control the refresh period for the memory device 420 according to the tier of the weakness information Info_tier. For example, a plurality of refresh commands CMD_Ref may be output from the memory controller 410 within one refresh period. When the refresh period is short, a refresh command reception period tREFI corresponding to a timer interval in which the memory device 420 receives the refresh commands CMD_Ref may be reduced. For example, the command generator 412 may output a refresh command CMD_Ref having the refresh command reception period tREFI changed according to the tier of the weakness information Info_tier.

Referring to FIG. 10, a memory device 500 may include a memory cell array 510, a refresh controller 520, a control logic 530, and a weakness detector 540, wherein the control logic 530 may include a target refresh controller 531, a TRR logic 532, and a delay/skip logic 533. The memory device 500 may receive a command CMD and/or an address ADD from a memory controller and communicate data DATA, wherein the command CMD may include a refresh command.

The weakness detector 540 may generate the weakness information Info_tier according to embodiments described above, and the weakness information Info_tier may be provided to the control logic 530. The control logic 530 may control various operations of the memory device 500 based on the weakness information Info_tier. According to embodiments described above, the TRR logic 532 may determine the position of a weak word line based on counting the number of activations for the word lines, and the target refresh controller 531 may provide a target refresh control signal Ctrl_TR including information regarding target refreshing, such that the refresh controller 520 performs a target refresh operation at a certain timing.

Moreover, the control logic 530 may differently control memory operations based on the weakness information Info_tier. For example, when the probability of loss of information regarding the activation counts of a plurality of word lines is increased due to frequent activations of the plurality of word lines, a control operation for reducing the activation frequencies of the plurality of word lines may be performed. For example, the delay/skip logic 533 may include a control circuit that delays or skips activation of word lines according to a memory operation request from the memory controller and may provide an activation control signal Ctrl_Act to the memory cell array 510. For example, according to the activation control signal Ctrl_Act, an activation timing of the word lines included in the memory cell array 510 may be delayed or some memory operations may not be performed as activation is skipped for the memory operations.

Figure 11:
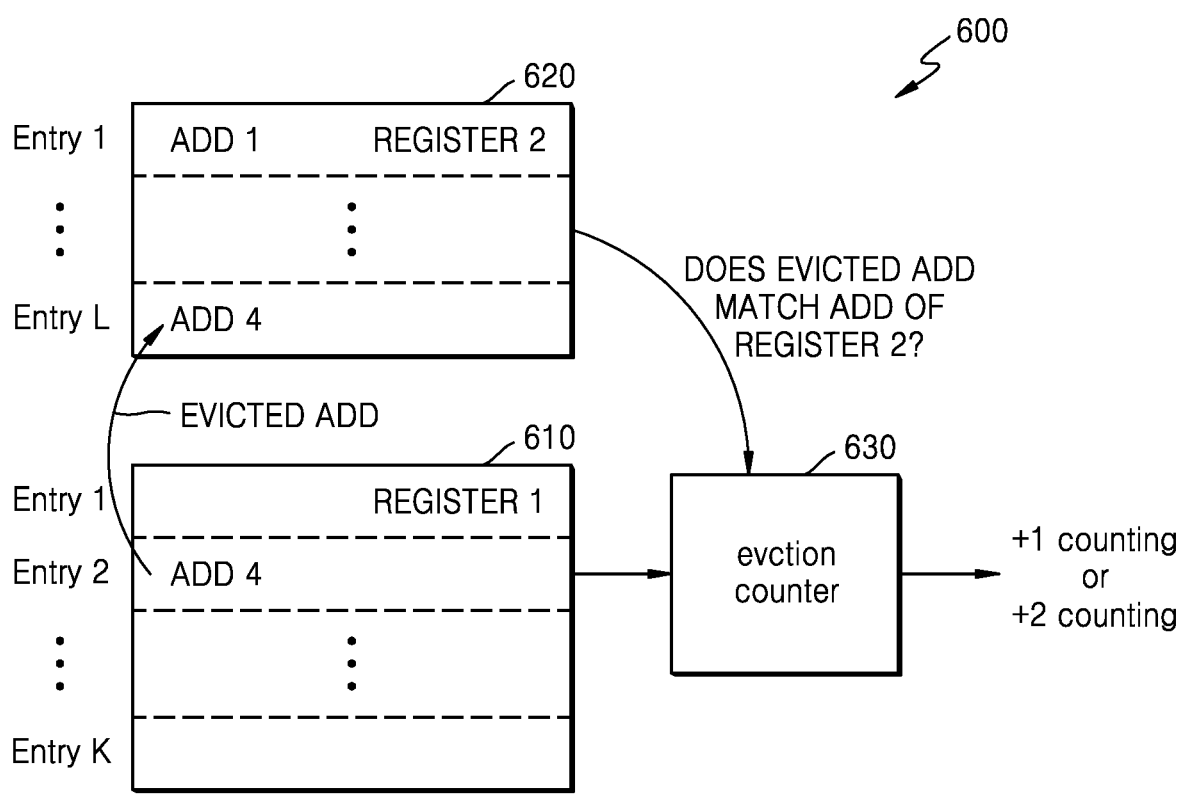
FIG. 11 is a block diagram showing an operation example of an eviction counter circuit according to an embodiment.

FIG. 11 is a block diagram showing an operation example of an eviction counter circuit according to an embodiment. FIG. 11 illustrates an example in which a weight is applied to a counted of the number of evictions.

Referring to FIG. 11, a memory device 600 may include a first register 610, a second register 620, and an eviction counter circuit 630. The first register 610 may store address information and activation count information regarding some of a plurality of word lines according to embodiments described above, and the eviction counter circuit 630 may perform an operation of outputting eviction information according to evictions of entries Entry 1 to Entry K of the first register 610.

The second register 620 may include a plurality of entries Entry 1 to Entry L and may store address information and/or activation count information regarding word lines evicted from the first register 610. According to an embodiment, the number of entries Entry 1 to Entry L of the second register 620 may be equal to or less than the number of entries Entry 1 to Entry K of the first register 610. In the entries Entry 1 to Entry L of the second register 620, address information and/or activation count information regarding word lines evicted from the first register 610 may be stored in the manner of First In First Out (FIFO). In this regard, when information is stored in all of the entries Entry 1 to Entry L of the second register 620 and additional information needs to be stored in the second register 620, eviction may be performed on an entry in which information is stored first from among the entries Entry 1 to Entry L of the second register 620.

According to an embodiment, as an entry of the first register 610 (e.g., a second entry Entry 2) is evicted, the eviction counter circuit 630 may perform a counting operation. At this time, the eviction counter circuit 630 may determine whether information evicted from the second entry Entry 2 of the first register 610 (e.g., an address ADD 4 of a fourth word line) is already stored in the entries Entry 1 to Entry L of the second register 620 and, when the address ADD 4 of the fourth word line evicted from the first register 610 matches address information stored in the second register 620, the eviction counter circuit 630 may count a value greater than 1 (e.g., 2 or a greater value).

In this regard, when, even though the address ADD 4 of the fourth word line has been previously evicted from the first register 610, as the fourth word line is activated again, the address ADD 4 of the fourth word line is stored in the first register 610 and is evicted again from the first register 610 later, the eviction counter circuit 630 may determine that entries of the first register 610 are evicted very frequently. In this case, to increase the tier of the weakness of the memory device 600, the eviction counter circuit 630 may count a value greater than 1 by applying a weight to counting and provide a counting result as eviction information.

Figure 12:
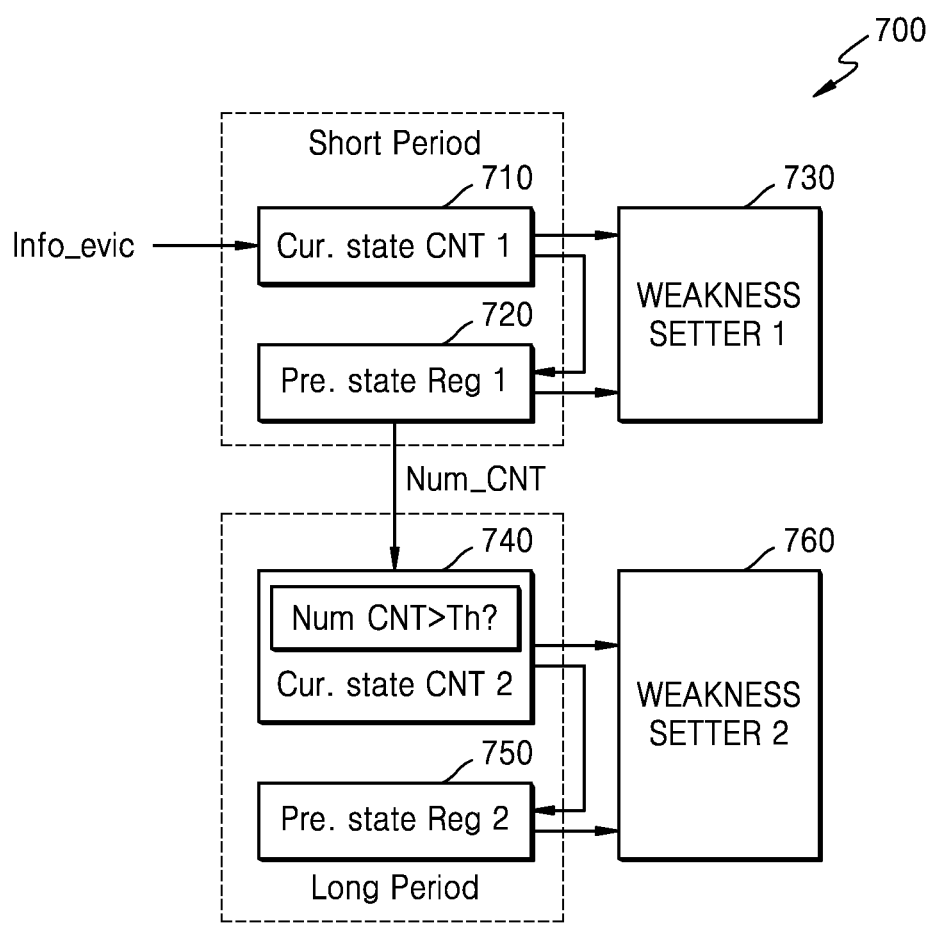
FIG. 12 is a block diagram showing a memory device that performs weakness detection according to an embodiment.

FIG. 12 is a block diagram showing a memory device that performs weakness detection according to an embodiment. In FIG. 12, an example of determining the number of evictions in a previous period and the number of evictions in a current period is shown. Also, according to an embodiment, the components shown in FIG. 12 may be applied to the weakness detector of embodiments described above.

A memory device 700 may include components for detecting a weakness in a first period (short period), e.g., a first current state counter 710, a first previous state register 720, and a first weakness setter 730. Also, the memory device 700 may further include components for detecting a weakness in a second period (long period), e.g., a second current state counter 740, a second previous state register 750, and a second weakness setter 760.

The first current state counter 710 may receive the eviction information Info_evic from a TRR logic every time an entry is evicted and perform a counting operation based on the eviction information Info_evic during the first period. For example, the eviction information Info_evic may correspond to information having a value of 1 every time eviction of an entry is performed, and the first current state counter 710 may perform a counting operation of accumulating the eviction information Info_evic received during the first period. Alternatively, when a weight is applied to an eviction operation according to embodiments described above, eviction information Info_evic having a value of 2 or greater may be provided to the first current state counter 710.

Also, every time the first period is elapsed, the first current state counter 710 may provide a counting result to the first previous state register 720, and the first current state counter 710 may perform a counting operation during a current first period. Information stored in the first current state counter 710 and the first previous state register 720 may be provided to the first weakness setter 730, and a weakness detection operation in a short period according to embodiments described above may be performed.

Information stored in the first previous state register 720 may be provided to the second current state counter 740 in every first period, and the information provided to the second current state counter 740 may correspond to eviction count information Num_CNT indicating the number of evictions of entries during the first period. According to an embodiment, the second current state counter 740 may perform a counting operation based on the eviction count information Num_CNT provided from the first previous state register 720 for each first period. For example, the second current state counter 740 may count the value of 1 when the number of evictions in each first period is greater than a certain threshold value Th. Also, the second current state counter 740 may perform the counting operation stated above during a second period and may provide a counting result every second period.

Also, the second current state counter 740 may provide a counting result to the second previous state register 750 every time the second period is elapsed, and the second current state counter 740 may perform a counting operation during a current second period. Information stored in the second current state counter 740 and the second previous state register 750 may be provided to the second weakness setter 760, and a weakness detection operation in a long period according to embodiments described above may be performed.

In embodiments described above, the first period and the second period may be set in various ways. For example, the first period may correspond to the refresh command reception period tREFI, and the second period may correspond to a refresh period in which all word lines included in the memory device 700 are refreshed at least once.

Figure 13:
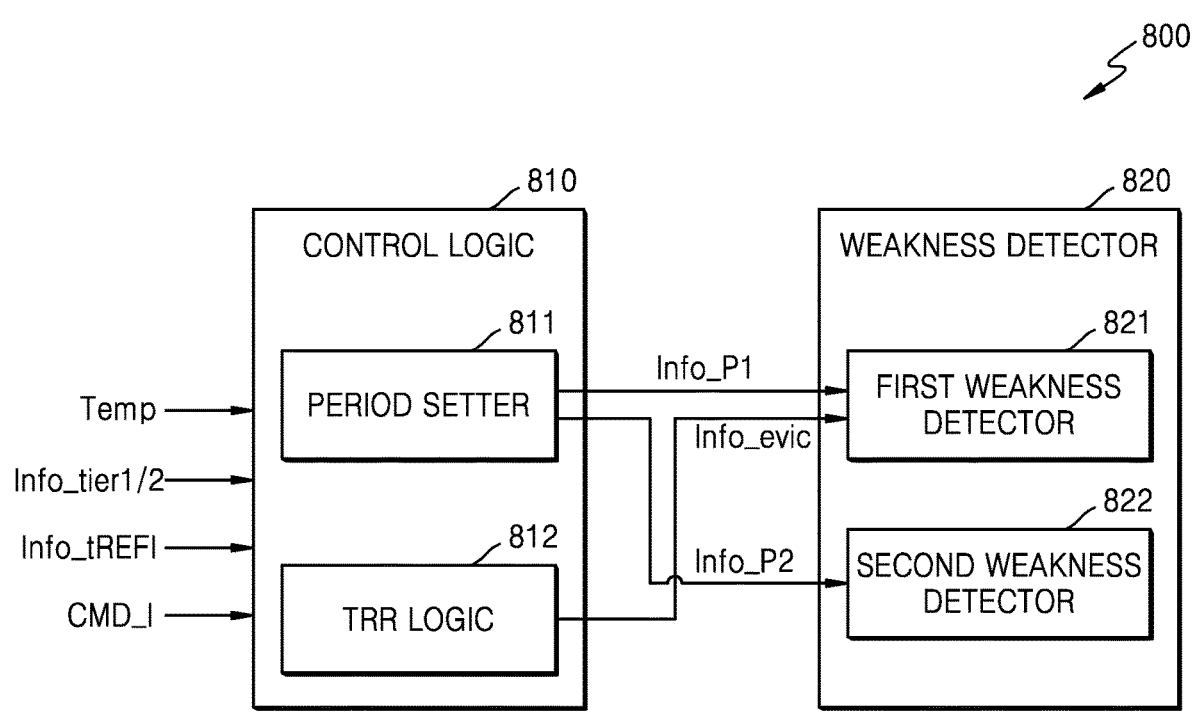
FIG. 13 is a block diagram showing a memory device according to another embodiment.

FIG. 13 is a block diagram showing a memory device according to another embodiment. In FIG. 13, an example in which a memory device 800 changes a first period and a second period for performing weakness detection is shown.

Referring to FIG. 13, the memory device 800 may include a control logic 810 and a weakness detector 820, and the control logic 810 may include a period setter 811 and a TRR logic 812. Also, the weakness detector 820 may include a first weakness detector 821 and a second weakness detector 822.

The control logic 810 may adjust a first period and a second period based on various types of information and/or commands. For example, the control logic 810 may receive at least one of temperature information Temp, first and second weakness information Info_tier ½, and information Info_tREFI indicating a refresh command reception period. Also, the memory device 800 may receive a command from a memory controller, and the command from the memory controller may be provided to the control logic 810 or an internal command CMD_I generated in the memory device 800 through decoding processing for the command may be provided to the control logic 810.

In operation of a memory system, a refresh period may vary according to a change in the temperature of the memory device 800. For example, when the refresh period is set to be long, the refresh frequency may decrease as the refresh command reception period tREFI increases. In this case, as the frequency of performing a refresh operation decreases, power consumption by a refresh operation may be reduced, but data retention characteristics may deteriorate. In this case, the period setter 811 may detect the degree of weakness of the memory device 800 in a short period by setting at least one of the first period and the second period to be short and may perform a care operation to handle deterioration of the data retention characteristics. Based on the above-stated period setting, the period setter 811 may provide information Info_P1 regarding the first period and information Info_P2 regarding the second period to the weakness detector 820. Also, according to embodiments described above, the TRR logic 812 may generate the eviction information Info_evic and provide the eviction information Info_evic to the weakness detector 820.

On the other hand, when the first and second weakness information Info_tier ½ is changed very frequently as the first period and/or the second period is set to be short, a large overhead may occur in managing and setting a care operation in response to the change. Therefore, the period setter 811 may determine the frequency at which the first and second weakness information Info_tier ½ is received and increase at least one of the first period and the second period based on the frequency. Alternatively, when the tiers of the first and second weakness information Info_tier ½ are low for a long time period, the weakness detector 820 may determine that the weakness of the memory device 800 is maintained relatively low. In this case, by increasing at least one of the first period and the second period, the period for determining the weakness may be set long.

According to embodiments as described above, in response to various patterns of attacks that a memory device may receive, the memory device itself may identify an attack pattern and provide information according to a result of the determination to a memory controller and an application processor or utilize the information internally, and thus the efficiency of a defense algorithm against various types of attacks from the outside may be improved.

Figure 14:
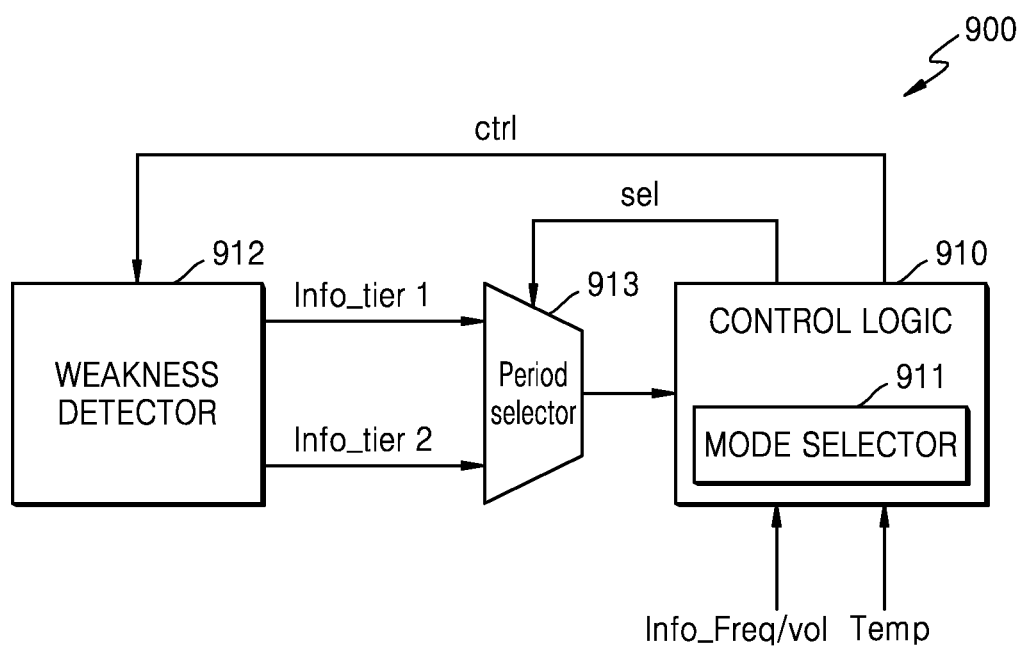
FIG. 14 is a block diagram showing an example of setting a period mode in a memory device.

FIG. 14 is a block diagram showing an example of setting a period mode in a memory device. FIG. 14, illustrates an example in which a short period mode or a long period mode is selected based on various factors is exemplified in detecting the weakness of a memory device 900.

The memory device 900 may include a control logic 910, a weakness detector 920, and a period selector 913, and the weakness detector 920 may include a mode selector 911. Because the control logic 910 and the weakness detector 920 operate in manners the same or similar to those described above, detailed descriptions thereof will be omitted.

The control logic 910 may control a mode setting based on various information, e.g., at least one of information Info_Freq/vol related to a frequency, a voltage of a clock signal used by the memory device 900 and the temperature information Temp. The weakness detector 920 may output the first weakness information Info_tier 1 indicating a weakness in a relatively short period and second weakness information Info_tier 2 indicating a weakness in a relatively long period. Also, the mode selector 911 may provide a control signal ctrl to the weakness detector 920 or provide a selection signal se1 to the period selector 913, based on the control of the control logic 910.

According to an embodiment, the memory device 900 may selectively utilize the weakness in a relatively short period or the weakness in a relatively long period. According to an embodiment, the weakness detector 920 may include a first weakness detector that outputs the first weakness information Info_tier 1 and a second weakness detector that outputs the second weakness information Info_tier 2. The control signal ctrl may disable the first weakness detector or the second weakness detector.

Alternatively, the period selector 913 may multiplex and output the first weakness information Info_tier 1 and the second weakness information Info_tier 2 or selectively output any one of the first weakness information Info_tier 1 and the second weakness information Info_tier 2 according to the selection signal se1. Weakness information output from the period selector 913 may also be provided to various components (e.g., a refresh controller, etc.) in the memory device 900.

According to an embodiment, as the memory device 900 operates at high performance, when the frequency of a clock signal is relatively high, the voltage level of the clock signal is high, or the temperature inside the memory device 900 is relatively high, the memory device 900 may be in a state sensitive to refresh and may correspond to a case in which data loss is highly probable according to the frequency of refresh. When the memory device 900 operates in a state sensitive to refresh as described above, the weakness of the memory device 900 needs to be detected in every short period, and thus the mode selector 911 may generate the selection signal sel and/or the control signal ctrl for setting the weakness detection mode to a short period detection mode.

On the other hand, when, as the memory device 900 operates at low performance, the frequency of a clock signal is relatively low, the voltage level of the clock signal is low, or the temperature inside the memory device 900 is relatively low, the weakness of the memory device 900 may be detected in every relatively long period, and thus the mode selector 911 may generate the selection signal sel and/or the control signal ctrl for setting the weakness detection mode to a long period detection mode.

Figure 15:
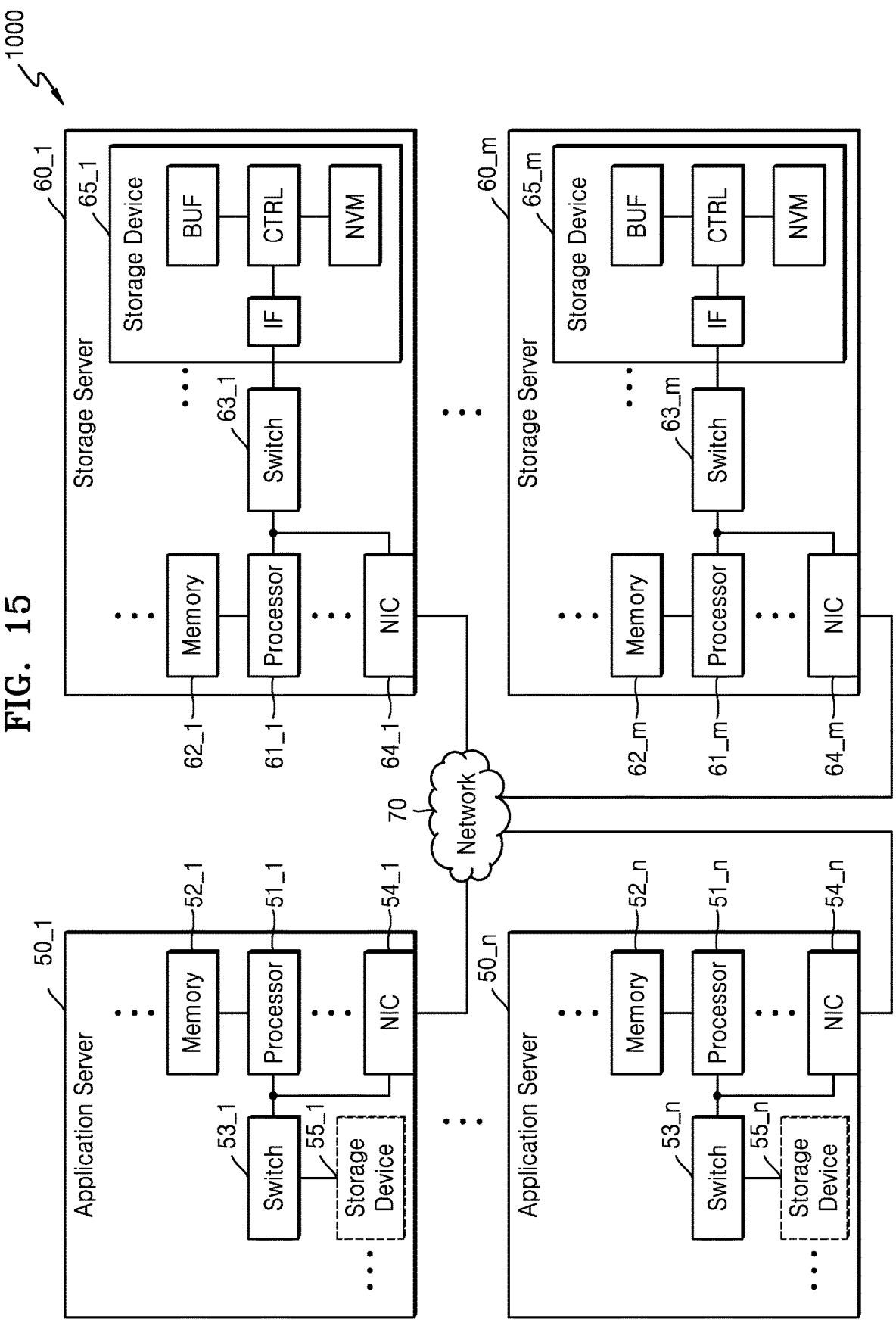
FIG. 15 is a block diagram showing a data center including a memory system according to an embodiment.

FIG. 15 is a block diagram showing a data center 1000 including a memory system according to an embodiment. According to some embodiments, a memory device or a memory system as described above with reference to the drawings may be included in an application server and/or a storage server of the data center 1000.

Referring to FIG. 15, the data center 1000 may collect various data and provide services and may also be referred to as a data storage center. For example, the data center 1000 may be a system for operating a search engine and a database or may be a computing system used by a company such as a bank or a government agency. As shown in FIG. 15, the data center 1000 may include application servers 50_1 to 50_n and storage servers 60_1 to 60_m (m and n are integers greater than 1). The number n of the application servers 50_1 to 50_n and the number m of the storage servers 60_1 to 60_m may be variously selected according to embodiments, and the number n of the application servers 50_1 to 50_n and the number m of the storage servers 60_1 to 60_m may be different from each other.

The application servers 50_1 to 50_n may include at least one of processors 51_1 to 51_n, memories 52_1 to 52_n, switches 53_1 to 53_n, network interface controllers (NIC) 54_1 to 54_n, and storage devices 55_1 to 55_n. The processors 51_1 to 51_n may control the overall operation of the application servers 50_1 to 50_n and execute instructions and/or data loaded to the memories 52_1 to 52_n by accessing the memories 52_1 to 22_n. The memories 52_1 to 22_n may include, as non-limiting examples, a double data rate synchronous DRAM (DDR SDRAM), a high bandwidth memory (HBM), a hybrid memory cube (HMC), a dual in-line memory module (DIMM), an optane DIMM, or a non-volatile memory DIMM (NVMDIMM).

According to embodiments, the number of processors and the number of memories included in the application servers 50_1 to 50_n may be variously selected. According to some embodiments, the processors 51_1 to 51_n and the memories 52_1 to 52_n may provide processor-memory pairs. In some embodiments, the numbers of processors 51_1 to 51_n and memories 52_1 to 52_n may be different from each other. The processors 51_1 to 51_n may each include a single-core processor or a multi-core processor. According to some embodiments, as indicated by a dotted line in FIG. 15, the storage devices 55_1 to 55_n may be omitted from the application servers 50_1 to 50_n. The number of storage devices 55_1 to 55_n included in the application servers 50_1 to 50_n may be variously selected according to embodiments. The processors 51_1 to 51_n, the memories 52_1 to 52_n, the switches 53_1 to 53_n, the NICs 54_1 to 54_n, and/or the storage devices 55_1 to 55_n may communicate with one another through the links described above with reference to the drawings.

The storage servers 60_1 to 60_m may include at least one of processors 61_1 to 61_m, memories 62_1 to 62_m, switches 63_1 to 63_m, NICs 64_1 to 64_n, and storage devices 65_1 to 65_m. The processors 61_1 to 61_m and the memories 62_1 to 62_m may operate similarly as the processors 51_1 to 51_n and the memories 52_1 to 52_n of the application servers 50_1 to 50_n described above.

The memories 52_1 to and the memories 62_1 to 62_m included in the application servers 50_1 to 50_n and the storage servers 60_1 to 60_m may include memory devices according to embodiments described above. For example, memories 52_1 to 52_n and 62_1 to 62_m may each include a volatile memory device such as a DRAM, and an operation of generating weakness information according to embodiments may be performed based on an operation of counting the number of activations regarding word lines and an operation of counting the number of evictions performed on a register including a plurality of entries.

The application servers 50_1 to 50_n and the storage servers 60_1 to 60_m may communicate with each other through a network 70. According to some embodiments, the network 70 may be implemented by using a fiber channel (FC) or Ethernet. The FC may be a medium used for relatively high-speed data transmission, and an optical switch providing high performance/high availability may be used. The storage servers 60_1 to 60_m may be provided as file storages, block storages, or object storages according to accessing methods of the network 70.

According to some embodiments, the network 70 may be a storage-only network such as a storage area network (SAN). For example, the SAN may use an FC network and may be an FC-SAN implemented according to an FC Protocol (FCP). Alternatively, the SAN may be an IP-SAN that uses a TCP/IP network and is implemented according to an iSCSI (SCSI over TCP/IP or Internet SCSI) protocol. According to some embodiments, the network 70 may be a general network such as a TCP/IP network. For example, the network 70 may be implemented according to protocols such as FC over Ethernet (FCoE), Network Attached Storage (NAS), and NVMe over Fabrics (NVMe-oF).

Hereinafter, an application server 50_1 and a storage server 60_1 are mainly described, but it should be noted that the description of the application server 50_1 may also be applied to other application servers (e.g., 50_n) and the description of the storage server 60_1 may also be applied to other storage servers (e.g., 60_m).

The application server 50_1 may store data requested to be stored by a user or a client in one of the storage servers 60_1 to 60_m through the network 70. Also, the application server 50_1 may obtain data requested to be read by a user or a client from one of the storage servers 60_1 to 60_m through the network 70. For example, the application server 50_1 may be implemented as a web server or a database management system (DBMS).

The application server 50_1 may access a memory 52_n and/or a storage device 55_n included in another application server 50_n through the network 70 and/or access the memories 62_1 to 62_m and/or the storage devices 65_1 to 65_m included in the memory devices 60_1 to 60_m through the network 70. Therefore, the application server 50_1 may perform various operations on data stored in the application servers 50_1 to 50_n and/or the storage servers 60_1 to 60_m. For example, the application server 50_1 may execute an instruction for moving or copying data between the application servers 50_1 to 50_n and/or the storage servers 60_1 to 60_m. At this time, data may be moved from storage devices 65_1 to 65_m of storage servers 60_1 to 60_m to the memories 52_1 to 52_n of the application servers 50_1 to 50_n through the memories 62_1 to 62_m of the storage servers 60_1 to 60_m or directly. In some embodiments, data moving through the network 70 may be data encrypted for security or privacy.

In the storage server 60_1, an interface IF may provide a physical connection between a processor 61_1 and a controller CTRL and a physical connection between an NIC 64_1 and the controller CTRL. For example, the interface IF may be implemented as a direct attached storage in which a storage device 65_1 is directly accessed through a dedicated cable. Also, for example, the interface IF may be implemented as one of various interface protocols such as advanced technology attachment (ATA), serial ATA (ATA), external SATA (e-SATA), small computer small interface (SCSI), aerial attached SCSI (SAS), peripheral component interconnection (PCI), PCI express (PCIe), NVM express (NVMe), IEEE 1394, universal serial bus (USB), a secure digital (SD) card, a multi-media card (MMC), an embedded multi-media card (eMMC), universal flash storage (UFS), an embedded universal flash storage (eUFS), and a compact flash (CF) card interface.

In the storage server 60_1, a switch 63_1 may selectively connect the processor 61_1 and the storage device 65_1 under the control of the processor 61_1 may selectively connect the NIC 64_1 and the storage device 65_1.

According to some embodiments, the NIC 64_1 may include a network interface card, a network adapter, etc. The NIC 64_1 may be connected to the network 70 through a wired interface, a wireless interface, a Bluetooth interface, an optical interface, etc. The NIC 64_1 may include an internal memory, a DSP, a host bus interface, etc., and may be connected to the processor 61_1 and/or the switch 63_1 through the host bus interface. According to some embodiments, the NIC 64_1 may be integrated with at least one of the processor 61_1, the switch 63_1, and the storage device 65_1.

The processors 51_1 to 51_m or 61_1 to 61_n in the application servers 50_1 to 50_n or the storage server 60_1 to 60_m may program or read data by transmitting commands to the storage devices 55_1 to 55_n or 65_1 to 65_m or the memories 52_1 to 52_n or 62_1 to 62_m. In this case, the data may be data that is error-corrected through an error correction code (ECC) engine. The data is data processed through data bus inversion (DBI) or data masking (DM) and may include cyclic redundancy code (CRC) information. The data may be data encrypted for security or privacy.

In response to the read command received from the processors 51_1 to 51_m and 61_1 to 61_n, the storage devices 55_1 to 55_n and 65_1 to 65_m may transmit control signals and command/address signals to a non-volatile memory device NVM (e.g., a NAND flash memory device). Therefore, when data is read from the non-volatile memory device NVM, a read enable signal may be input as a data output control signal and serve to output data to a DQ bus. A data strobe signal may be generated by using a read enable signal. A command and address signal may be latched according to a rising edge or a falling edge of a write enable signal.

The controller CTRL may control the overall operation of the storage device 65_1. According to an embodiment, the controller CTRL may include a static random access memory (SRAM). The controller CTRL may write data to the non-volatile memory device NVM in response to a write command or read data from the non-volatile memory device NVM in response to a read command. For example, a write command and/or a read command may be generated based on a request provided by a host, e.g., the processor 61_1 in the storage server 60_1, the processor 61_m in another storage server 60_m, or the processors 51_1 to 51_n in the application servers 50_1 to 50_n. A buffer BUF may temporarily store (buffer) data to be written to the non-volatile memory device NVM or data read from the non-volatile memory device NVM. According to some embodiments, the buffer BUF may include a DRAM. Also, the buffer BUF may store meta data, and the meta data may refer to user data or data generated by the controller CTRL to manage the non-volatile memory device NVM. The storage device 35_1 may include a secure element (SE) for security or privacy.

In some embodiments, each of the components represented by a block as illustrated in FIGS. 1, 3-6 and 9-15 may be implemented as various numbers of hardware, software and/or firmware structures that execute respective functions described above, according to embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of embodiments have been particularly shown and described, it will be understood that various changes in form and details may be made therein without departing from the spirit and scope of the following claims.

What is claimed is:

1. A method of operating a memory device, which includes a plurality of word lines and a register comprising N entries (N is an integer equal to or greater than 2), the method comprising:
    storing address information and activation count information regarding N word lines from among the plurality of word lines in the register;
    based on activation of a first word line different from the N word lines, evicting address information and activation count information regarding at least one of the N word lines from an entry among the N entries of the register, storing address information and activation count information regarding the first word line in the entry from which the address information and the activation count information have been evicted; and
    generating first weakness information based on a number of evictions performed on the register during a first period.

2. The method of claim 1, further comprising outputting the first weakness information to a memory controller.

3. The method of claim 2, wherein the first weakness information is configured to control the memory controller to change a reception period of a refresh command provided from the memory controller.

4. The method of claim 1, further comprising providing the first weakness information to a refresh controller in the memory device; and
controlling a refresh operation for the memory device according to the first weakness information.

5. The method of claim 4, further comprising:
identifying, from among the plurality of word lines, a frequently activated word line and a weak word line adjacent to the frequently activated word line; and
selectively refreshing the weak word line.

6. The method of claim 1, further comprising comparing a number of evictions counted during a previous first period with a number of evictions counted during a current first period,
wherein the generating the first weakness information comprises increasing a tier of the first weakness information based on the number of evictions counted during the current first period being greater than the number of evictions counted during the previous first period.

7. The method of claim 1, further comprising generating second weakness information based on a number of evictions during a second period that is longer than the first period.

8. The method of claim 7, further comprising outputting the first weakness information and the second weakness information to a memory controller.

9. The method of claim 7, further comprising comparing a number of evictions counted during a previous second period with a number of evictions counted during a current second period,
wherein the generating the second weakness information comprises increasing a tier of the second weakness information based on the number of evictions counted during the current second period being greater than the number of evictions counted during the previous second period.

10. The method of claim 1, wherein the first weakness information indicates one of a plurality of tiers, and
wherein the method further comprises delaying or skipping a memory operation based on the first weakness information increasing.

11. A memory device comprising:
a memory cell array comprising a plurality of word lines;
a refresh controller configured to control a refresh operation on the plurality of word lines;
a control logic circuit configured to store, in a register comprising N entries (N is an integer equal to or greater than 2), address information and activation count information regarding N word lines from among the plurality of word lines, evict information stored in at least one entry from among the N entries based on activation of a first word line different from the N word lines by deleting address information and activation count information regarding at least one of the N word lines from the at least one entry of the register, and store address information and activation count information regarding the first word line in the at least one entry from which the address information and the activation count information have been deleted; and
a weakness detection circuit configured to generate first weakness information based on a number of evictions performed on the register during a first period.

12. The memory device of claim 11, wherein the first weakness information indicates one of a plurality of tiers, and
wherein the weakness detection circuit is further configured to increase a tier of the first weakness information based on an increase in the number of evictions performed on the register.

13. The memory device of claim 11, wherein the control logic circuit is further configured to provide eviction information to the weakness detection circuit based on an eviction being performed on the register, and
wherein the weakness detection circuit comprises a counter configured to count the eviction information provided during the first period.

14. The memory device of claim 11, wherein the weakness detection circuit is configured to generate the first weakness information based on a comparison between a number of evictions in a previous first period and a number of evictions in a current first period.

15. The memory device of claim 11, wherein the weakness detection circuit is further configured to generate second weakness information based on second eviction count information based on a number of evictions performed during a second period that is longer than the first period.

16. The memory device of claim 15, wherein the weakness detection circuit is further configured to generate the second weakness information based on a comparison between a number of evictions in a previous second period and a number of evictions in a current second period.

17. The memory device of claim 15, wherein the second period comprises a plurality of first periods, and
wherein the second eviction count information corresponds to a value obtained by counting a number of the plurality of first periods in which a number of evictions exceeds a threshold value.

18. A memory device comprising:
a memory cell array comprising a plurality of word lines;
a refresh controller configured to control a refresh operation on the plurality of word lines;
a control logic circuit configured to store address information and activation count information in a register comprising N entries (N is an integer equal to or greater than 2) and generate eviction information based on evictions performed on the register; and
a weakness detection circuit configured to generate first weakness information corresponding to a first period and second weakness information corresponding to a second period longer than the first period, based on the eviction information,
wherein the weakness detection circuit comprises:
a first current state counter configured to generate and store eviction count information indicating a number of evictions during a current first period; and
a first previous state register configured to store eviction count information corresponding to a previous first period,
wherein the weakness detection circuit is further configured to generate the first weakness information based on a comparison between the eviction count information corresponding to the current first period and the eviction count information corresponding to the previous first period, and
wherein the number of evictions during the current first period indicates a number of times address information and activation count information regarding word lines stored in the N entries are deleted from the register during the current first period.

19. The memory device of claim 18, wherein the weakness detection circuit further comprises:
- a second current state counter configured to receive the eviction count information corresponding to the previous first period from the first previous state register, and generate and store eviction count information corresponding to a current second period by counting eviction count information for a plurality of first periods during the second period; and
- a second previous state register configured to store eviction count information corresponding to a previous second period, and
- wherein the weakness detection circuit is further configured to generate the second weakness information based on a comparison between the eviction count information corresponding to the current second period and the eviction count information corresponding to the previous second period.

20. The memory device of claim 19, wherein the second current state counter is further configured to generate a value obtained by counting a number of the plurality of first periods during the second period in which a number of evictions exceeds a certain threshold value as the eviction count information corresponding to the current second period.

* * * * *